United States Patent
Paraiso et al.

(10) Patent No.: US 11,509,399 B2
(45) Date of Patent: Nov. 22, 2022

(54) OPTICAL MODULE, A SYSTEM, A SENDING UNIT, A RECEIVING UNIT, AND A QUANTUM COMMUNICATION SYSTEM

(71) Applicant: Kabushiki Kaisha Toshiba, Tokyo (JP)

(72) Inventors: Taofiq Paraiso, Cambridge (GB); Mirko Sanzaro, Cambridge (GB); Thomas Roger, Cambridge (GB); Davide Giacomo Marangon, Cambridge (GB); Innocenzo De Marco, Cambridge (GB); Zhiliang Yuan, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/187,484

(22) Filed: Feb. 26, 2021

(65) Prior Publication Data

US 2022/0166522 A1    May 26, 2022

(30) Foreign Application Priority Data

Nov. 20, 2020 (GB) ...................................... 2018329

(51) Int. Cl.
*H04B 10/70* (2013.01)
*H01L 23/373* (2006.01)
(Continued)

(52) U.S. Cl.
CPC .......... *H04B 10/70* (2013.01); *H01L 23/373* (2013.01); *H01L 23/38* (2013.01);
(Continued)

(58) Field of Classification Search
CPC ....... H04B 10/70; H04B 10/40; H01L 23/373; H01L 23/38; H01L 31/0203; H01L 31/024; H01R 12/721
(Continued)

(56) References Cited

U.S. PATENT DOCUMENTS

| | | | |
|---|---|---|---|
| 6,762,938 B2 * | 7/2004 | Tayebati | H01S 5/02415 62/3.2 |
| 8,750,710 B1 * | 6/2014 | Hirt | H04B 10/25759 398/9 |

(Continued)

FOREIGN PATENT DOCUMENTS

| | | |
|---|---|---|
| GB | 2537821 A | 11/2016 |
| GB | 2564446 B | 1/2020 |

(Continued)

OTHER PUBLICATIONS

PDK Cordon Electronics(packaging) available at: https://www.synopsys.com/photonic-solutions/pic-desion-suite/process-design-_kits/pdk-cordon-electronics.html Oct. 30, 2020, 6 pages.

(Continued)

*Primary Examiner* — Dalzid E Singh
(74) *Attorney, Agent, or Firm* — Oblon, McClelland, Maier & Neustadt, L.L.P.

(57) ABSTRACT

An optical module includes: a quantum photonic integrated circuit; a temperature controller; and a housing configured to house the photonic integrated circuit and the temperature controller. The photonic integrated circuit is attached to the temperature controller, such that the photonic integrated circuit is in thermal communication with the temperature controller, and the temperature controller is attached directly to the housing, such that the temperature controller is in direct thermal communication with the housing.

20 Claims, 18 Drawing Sheets

(51) Int. Cl.
    *H01L 23/38* (2006.01)
    *H01L 31/0203* (2014.01)
    *H01L 31/024* (2014.01)
    *H04B 10/40* (2013.01)
    *H01R 12/72* (2011.01)

(52) U.S. Cl.
    CPC ........ *H01L 31/0203* (2013.01); *H01L 31/024* (2013.01); *H04B 10/40* (2013.01); *H01R 12/721* (2013.01)

(58) Field of Classification Search
    USPC ........................................................ 398/135
    See application file for complete search history.

(56) References Cited

U.S. PATENT DOCUMENTS

| | | | |
|---|---|---|---|
| 8,812,760 B1* | 8/2014 | Bamford | G06F 13/40 710/110 |
| 10,725,254 B2* | 7/2020 | Shastri | G02B 6/4204 |
| 2004/0022543 A1* | 2/2004 | Hosking | H04B 10/40 398/135 |
| 2009/0195980 A1* | 8/2009 | Shih | F25B 21/02 62/126 |
| 2011/0229129 A1* | 9/2011 | Hu | H04B 10/506 398/25 |
| 2011/0299858 A1* | 12/2011 | Mazzini | H04B 10/516 398/183 |
| 2012/0128290 A1* | 5/2012 | Han | G02B 6/4281 385/14 |
| 2014/0003457 A1 | 1/2014 | Shastri et al. | |
| 2014/0345297 A1* | 11/2014 | Saeki | F25B 21/02 62/3.6 |
| 2016/0190418 A1* | 6/2016 | Inomata | H01L 33/502 257/98 |
| 2017/0363823 A1 | 12/2017 | Mentovich et al. | |
| 2019/0391348 A1 | 12/2019 | Osenbach et al. | |
| 2020/0412531 A1* | 12/2020 | Kim | G06N 10/00 |
| 2020/0413569 A1* | 12/2020 | Weng | G06F 1/20 |

FOREIGN PATENT DOCUMENTS

| | | |
|---|---|---|
| GB | 2555398 B | 4/2020 |
| GB | 2551483 B | 5/2020 |
| WO | WO 2019/060817 A2 | 3/2019 |

OTHER PUBLICATIONS

Xiulai Xu, et al., ""Plug and play" single-photon sources", Applied Physics Letters, vol. 90 No. 6, Feb. 5, 2007, 4 pages.

Meint Smit, et al., "An introduction to InP-based generic integration technology", Semiconductor Science and Technology, 29(8): 083001, Jun. 13, 2014, 42 pages.

PDK Cordon Electronics(packaging) available at: https://www.synopsys.com/phetonic-solutions/pic-desion-suite/process-design-kits/pdk-cordon-electronics.html Oct. 30, 2020, 6 pages.

Christopher R. Doerr, "Silicon photonic integration in telecommunications", Frontiers in Physics, 3:37, Aug. 5, 2015, 16 pages.

100G PSM4: The Most Configurable & Lowest-Cost Single-Mode Transceiver Available datasheet, Oct. 30, 2020, 8 pages.

Combined United Kingdom Search and Examination Report dated Jul. 26, 2021 in United Kingdom Patent Application No. GB2018329.9, 12 pages.

M. D., Eisaman, et al., "Invited Review Article: Single-photon sources and detectors", Review of Scientific Instruments, vol. 82 No. 7, Jul. 27, 2011, 26 pages.

Xiuiai Xu, et al. ""Plug and play" single-photon sources", Applied Physics Letters, vol. 90 No. 6, Feb. 5, 2007, 4 pages.

* cited by examiner

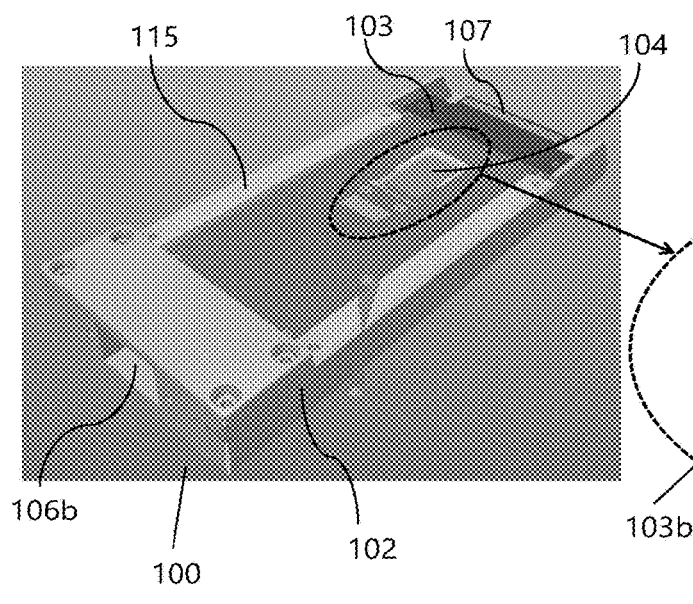
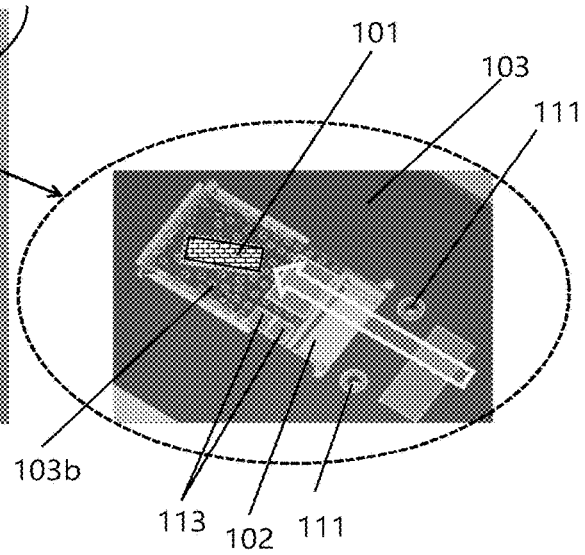
Figure 2 (a)
Figure 2 (b)

OPTICAL MODULE, A SYSTEM, A SENDING UNIT, A RECEIVING UNIT, AND A QUANTUM COMMUNICATION SYSTEM

CROSS-REFERENCE TO RELATED APPLICATIONS

This application is based upon and claims the benefit of priority from prior United Kingdom Application number 2018329.9 filed on 20 Nov. 2020, the entire contents of which are incorporated herein by reference.

FIELD

Embodiments herein relate generally to an optical module, a system, a sending unit, a receiving unit, and a quantum communication system.

BACKGROUND

Optical modules are used in communications systems and comprise an electrical interface and an optical interface. The electrical interface connects to an electronic board while the optical interface connects to input and/or output optical links. For example, the optical link comprises fibre optic cable. Optical modules may also be referred to as fibre optic transceivers or optical transceivers. Optical modules act as an interface between electrical signals on the electronic board and optical signals inputted or outputted via the optical links. Optical modules can be connected and disconnected from the electronic board as required. Optical modules may be pluggable.

In communication systems, the exchange of secret cryptographic keys between two parties underpins the security of the communication systems.

A quantum communication system may be used to share secret cryptographic keys between two nodes, a source node and a destination node, often referred to as "Alice" and "Bob", and this technique is known as quantum key distribution (QKD). In a quantum communication network, information is sent between a transmitter and a receiver by encoded single quanta, such as single photons. Each photon carries one bit of information encoded upon a property of the photon, such as its polarization, phase or frequency/time. The photon may even carry more than one bit of information, for example, by using properties such as angular momentum.

The attraction of QKD is that it provides a test of whether any part of the key can be known to an unauthorized eavesdropper "Eve". In many forms of QKD, Alice and Bob use two or more non-orthogonal bases in which to encode the bit values. The laws of quantum mechanics dictate that measurement of the photons by Eve without prior knowledge of the encoding basis of each causes an unavoidable change to the state of some of the photons. These changes to the states of the photons will cause errors in the bit values sent between Alice and Bob. By comparing a part of their common bit string, Alice and Bob can thus determine if Eve has gained information.

BRIEF DESCRIPTION OF FIGURES

Embodiments will now be described, by way of example only, with reference to the accompanying figures in which:

FIG. 2 (a) shows a perspective view of the optical module in assembled form;

FIG. 2 (b) shows a perspective view of parts of the optical module in assembled form;

FIG. 11 (b) shows the time varying current applied to the gain-switched laser by a controller;

FIG. 11 (c) shows the time varying current applied to the gain-switched laser by an intensity control element;

FIG. 11 (d) shows the light pulses emitted from the gain-switched laser;

DETAILED DESCRIPTION

Figure 1:
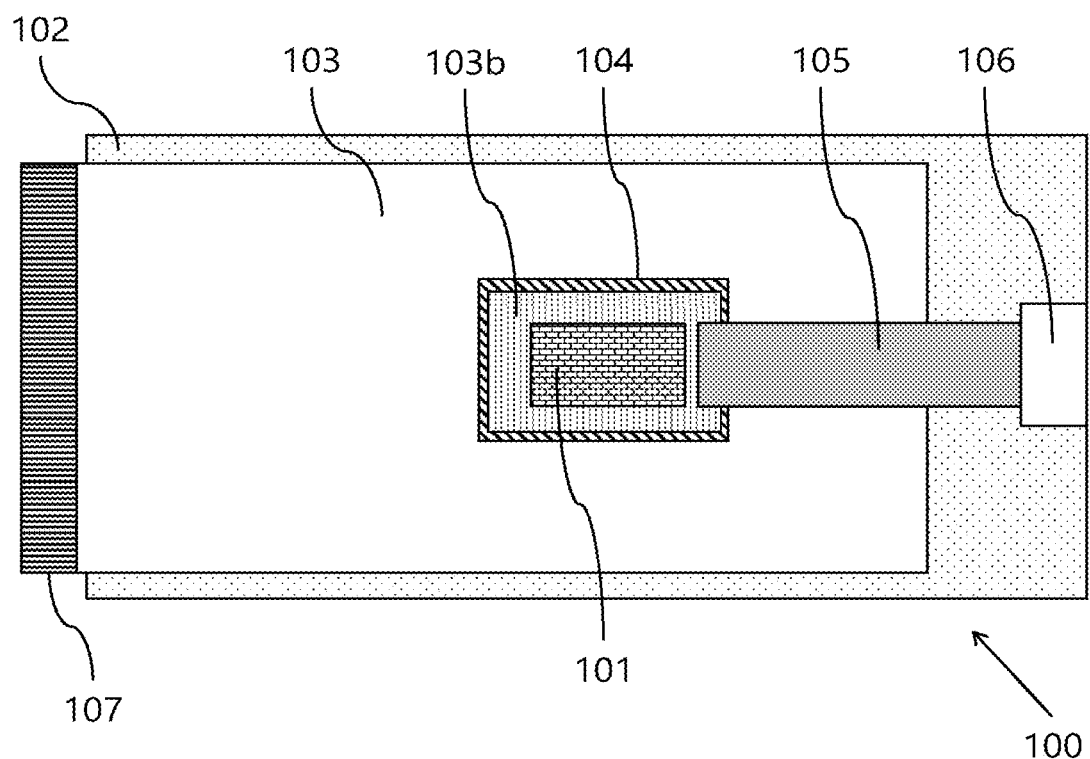
FIG. 1 shows a plan view of an optical module according to an embodiment.

In an embodiment, an optical module is provided comprising:
   a quantum photonic integrated circuit;
   a temperature control element; and
   a housing configured to house said photonic integrated circuit and said temperature control element,
   wherein the photonic integrated circuit is attached to the temperature control element, such that said photonic integrated circuit is in thermal communication with said temperature control element; and
   the temperature control element is attached directly to the housing, such that said temperature control element is in direct thermal communication with the housing.

Quantum photonic integrated circuits allow the generation, the manipulation or the analysis of quantum properties of optical signals. They typically operate at the quantum level, i.e. down to the single photon level. They may use quantum phenomena to generate photonic qubits or to extract quantum information from quantum fluctuations.

Optical modules comprise a housing that surrounds and protects components. The components comprise a receiver and/or a transmitter, for example. Further, optical modules comprise an electrical interface configured to plug into an electronic board, and an optical interface configured to connect to input and/or output optical links. The electronic board is also referred to as a host electronic board. The host electronic board is external to the optical module. An optical module is configured to be repeatedly connected and disconnected from the host electronic board.

In some examples, an optical module is configured to be plugged and unplugged from the host electronic board. Such optical modules are also referred to as pluggable modules.

Pluggable modules have standard form factors that ensure interoperability. Examples of standard form factors include the Small form-factor pluggable (SFP) transceiver, C form-factor pluggable (CFP), and XFP (10 Gigabit Small Form Factor Pluggable), amongst others.

Pluggable modules may not use photonic integrated circuits (PICs), and, instead, they may comprise individual miniature photonic components (such as light sources, detectors, isolators and/or lenses) that are each packaged into their own optical sub-assemblies.

When pluggable modules are used with photonic integrated circuits (PICs), the PICs are first packaged into an optical sub-assembly which is then assembled inside the pluggable module. The assembly process for a PIC in a pluggable module comprises firstly packaging the PIC into an optical sub-assembly, and then assembling the optical sub-assembly into the optical module.

An example of an optical sub-assembly is a multi-pin package. Multi-pin packages include 'butterfly'-style packages. Multi-pin packages generally comprise a housing into which components can be mounted, an opening for an optical input and/or output, and pins on the exterior of the housing that are configured to provide electrical contact to components mounted inside the housing, from the exterior of the multi-pin package. The pins are soldered to other components or to a printed circuit board (PCB), for example a PCB inside the module. Once fixed, such optical sub-assemblies may not be plugged and unplugged.

The module may further comprise a circuit board configured to route electric signals to and/or from the photonic integrated circuit.

In an embodiment, the module may comprise an interposer chip, wherein the interposer chip is provided between the photonic integrated circuit and the temperature control element. The interposer chip may comprise a thermally conductive chip carrier. The interposer chip may be configured to route electric signals from the photonic integrated circuit to the circuit board.

The housing may be configured to a dissipate heat. The module may also comprise a temperature sensor, wherein the temperature sensor is configured to monitor the temperature of the photonic integrated circuit. The temperature sensor may be provided on the photonic integrated circuit.

In a further embodiment, an optical component is provided that is configured to collect or inject light into the photonic integrated circuit.

The temperature control element may comprise a thermoelectric cooler or a resistive heater.

As noted above, the module comprises a quantum photonic integrated circuit. The photonic integrated circuit may be configured to operate as:
a quantum communication transmitter;
a quantum communication receiver;
a quantum random number generator; and/or
a quantum information processor.

In an embodiment, the quantum photonic integrated circuit will use components with low losses. In QKD any loss in the receiver contributes to an excess of noise and significantly reduces the secret key distribution rate and the distance at which a key can be exchanged. In quantum information processors any loss of photon corresponds to a loss of information and reduces the efficiency of the quantum algorithm. In a QKD transmitter the qubits are generated using pulses of light that are attenuated to contain in average less that one photon per pulse. Such attenuation can be done outside of the module. In a QKD transmitter unit, the photon flux (average number of photon per pulse) at the output of the transmitter is typically in the range of 0.3-0.4 photon per pulse, for the T12 protocol.

Some quantum photonic integrated circuits will comprise single photon detectors or single photon sources.

The optical module may also be incorporated into a system, the system further comprising a host electronic board, wherein the optical module is configured to be plugged into the host electronic board.

The host electronic board may be configured to generate an electric signal for controlling the photonic integrated circuit. The host electronic board may be configured to generate an electric signal for controlling the temperature control element. The host electronic board may also be configured to acquire an electric signal generated by the photonic integrated circuit. The host electronic board may comprise a socket, wherein the circuit board is configured to plug into the socket.

The circuit board may comprise a connector configured to plug into the socket.

In a further embodiment, a sending unit for a quantum communication system is provided, the sending unit comprising:
the system as described above, wherein the photonic integrated circuit comprises:
a quantum bit source configured to generate quantum bits;
a quantum bit encoder configured to encode the generated quantum bits for sending to a receiving unit; and
an intensity control element configured to modulate the intensity of the quantum bits.

In a further embodiment, a receiving unit for a quantum communication system is provided, the receiving unit comprising:
the system as described above, wherein the photonic integrated circuit comprises a quantum bit decoder configured to decode encoded quantum bits generated by a sending unit.

In a further embodiment, a quantum communication system is provided comprising: the above sending and receiving unit and an optical link configured to connect the sending unit to the receiving unit.

FIG. 1 shows a plan view of an optical module 100 according to an embodiment. In an example, the optical module 100 is configured for a quantum device. The optical module 100 comprises a housing 102 configured to house a plurality of components that will be described next. The optical module 100 comprises a temperature control element (TCE) 104 which is attached directly onto the housing 102. By directly attaching the TCE 104 to the housing 102, it is meant that either the TCE 104 is attached to the housing 102 without any other part between them, or that the TCE 104 is attached to the housing 102 with a thermal interface material provided between them. The thermal interface material (TIM) is configured to conduct heat between the TCE 104 and the housing 102. The TIM may be a thermally conductive paste or thermally conductive adhesive, for example. The purpose of directly attaching the TCE 104 to the housing 102 is for the TCE 104 and the housing 102 to be in direct thermal communication with each other such that heat is efficiently exchanged. In particular, the housing 102 is configured to act as a heat sink such that heat generated by the TCE 104 is dissipated by the housing 102. Part of the housing is made of metal. In an embodiment, the part of the housing 102 that is in contact with the TCE 104 is made of metal. For example, the housing comprises aluminium.

The optical module 100 further comprises a quantum photonic integrated circuit (PIC) 101. The PIC 101 is a semiconductor bare die. The PIC 101 comprises a substrate onto which optical components are integrated. In an example, the PIC is based on an InP, Si, and/or silicon nitride standard integration process. In an example, the PIC 101 is based on a hybrid InP on Si, or GaAs on Si process. In another example, when PIC 101 is configured as a receiver only, the PIC 101 may be based on a fully passive Si or silicon nitride process. Different components are optically connected to one another by means of light guiding sections. The PIC 101 may further comprise an emitter (FIG. 16); a receiver (FIG. 17) and/or other components as described below.

The optical module 100 further comprises a chip carrier 103b. The chip carrier 103b is also referred to as an interposer. The PIC 101 is mounted onto the chip carrier 103b, and the chip carrier 103b is then itself attached to the TCE 104. Thus, the chip carrier 103b is provided between the TCE 104 and the PIC 101. The PIC 101 is mountable onto the chip carrier 103b using any suitable method such as adhesive bonding, or flip chip bonding. In an example, when adhesive bonding comprises the use of thermos-conductive epoxy. The chip carrier 103b is itself directly attached to the TCE 104. The expression 'directly attached' has the same meaning as described above in relation to the TCE 104 and the housing 102.

The chip carrier 103b acts as an electrical interface between the PIC 101 and an internal electronic board 103 (which will be described later). For example, electrical contacts on the PIC 101 may be connected to corresponding contacts on the chip carrier 103b by way of wire bonds (not shown). Other means of electrically connecting the PIC 101 to the chip carrier 103b may be also be used. The chip carrier 103b is configured to direct electric signals from the PIC 101 to the circuit board 103. The electrical connection from the chip carrier 103b to the internal circuit board 103 may be implemented by wire bonding, or any other suitable means (not shown).

Furthermore, the chip carrier 103b is configured to provide a thermally conductive path from the PIC 101 to the TCE 104. Additionally and optionally, the chip carrier 103b comprises a thermally conductive material. Additionally and optionally, the chip carrier 103b comprises alumina (Al2O3) or aluminium nitride (AlN) or Rogers laminates®.

The temperature control element (TCE) 104 is configured to actively stabilize the temperature of the PIC 101, which is in thermal communication with the TCE 104 via the chip carrier 103b. By stabilising the temperature, it is meant that the temperature is kept at or near a set value. In an example, the TCE 104 is configured to keep the temperature of the PIC 101 to within at least 0.1° C. of the set value. In another example, the temperature is kept within at least 0.01° C. of the set value. In another example, the temperature is kept within at least 0.001° C. of the set value. By actively stabilizing the temperature, it is meant that a control signal is provided to the TCE 104 in order to cause it to stabilize the temperature of the PIC 101.

In an example, the TCE 104 is configured to electrically stabilize the temperature of the PIC 101. An electrical control signal is input to the TCE to cause a change in temperature.

Stabilising the temperature of the PIC 101 reduces drifts in the behaviour of the components of the PIC 101. Therefore, the PIC 101 and hence the optical module 100 may perform more reliably. In an example, when the PIC is used QKD, temperature changes in the PIC translate into phase changes for the photon at the transmitter or at the receiver, which would be interpreted as noise in the quantum signal and limit the performance of the key exchange.

Additionally and optionally, the temperature control element TCE 104 comprises a thermoelectric cooler. The thermoelectric cooler (also referred to as a thermoelectric device) is configured to transfer heat from a cold side to a hot side when a voltage is applied, thereby creating a temperature difference across said cooler. For example, the thermoelectric device may be a Peltier device. A Peltier device comprises a thermocouple (a junction of two different conductors), wherein, on application of an electric current, heat may be generated or removed from the junction. By having the one side thermally coupled to the PIC 101 via the chip carrier 103b, and another side being thermally coupled to the housing 102, the thermoelectric cooler may pump or remove heat from the PIC 101 in order to adjust its temperature. The thermoelectric device may be controlled by an electrical control signal. The electrical control signal may be routed to the thermoelectric device by way of the internal circuit board 103. The electrical control signal may be provided by a temperature control element (TCE) controller (not shown). In an example, the TCE controller is provided in an electronic host board. In another example, the TCE controller is provided on the internal electronic board 103.

Alternatively, instead of the thermoelectric device, a resistive heater may be used instead. The resistive heater causes heating by the process of Joule heating and is controlled by passing an electrical control signal (e.g. a current) through it. The resistive heater may only cause heating, unlike the thermoelectric device.

The module 100 further comprises an internal electronic board 103. For example, the internal electronic board 103 may be a printed circuit board (PCB). As shown in FIG. 1, the internal circuit board 103 comprises an electrical plug connector 107. The purpose of the internal electronic board 103 is to route electric signals from chip carrier 103b to the electrical plug connector 107. Optionally, the internal electronic board 103 comprises further electric components such as small memories or micro-processor units. The chip carrier 103b connects the internal electronic board 103 to the PIC 101 as described above. The electrical plug connector 107 is configured to enable electrical access from the exterior of the module 100. Thus, circuit board 103 and components that are electrically connected to it can be electrically accessed from the exterior of the module 100. By electrical access, it is meant that there is an electrical connection such that an electric signal may be applied or read out. In the embodiment of FIG. 1, the electrical plug connector 107 is configured to plug into a receptacle connector. The receptacle may be located in an electronic host board, as will be described further below. The circuit board 103 is shown in more detail in FIG. 2 (*a*) and (*b*). FIG. 2 (*a*) shows that the circuit board 103 is isolated from the TCE 104. By isolated, it is meant that the circuit board 103 is thermally isolated from TCE 104. In other words, there is no intentional thermal communication path between the circuit board 103 and the chip carrier 103*b*. By intentional, it is meant the circuit board 103 is not configured to be in thermal communication with the chip carrier 103*b*; however, in practice, heat may flow between the two components. Thus, there is also no intentional thermal communication between the circuit board 103 and the TCE 104, which is connected to the chip carrier 103*b*. The effect of this arrangement is to improve the efficiency of the TCE 104. If the PCB 103 is in contact with the TCE 104 this increases the thermal load to stabilize in temperature.

In an example, the PCB 103 is mounted on the housing and the TCE 104 is a Peltier device. If the PCB touches the top of the Peltier while the bottom of the Peltier is in contact with the housing 102, this creates an unwanted loop between the top and the bottom of the Peltier, which is detrimental for stabilization. Additionally and optionally, when contact between the PCB and the TCE is unavoidable, thermal insulation trenches are cut into the PCB to limit the heat transfer between the part of the PCB in contact with the TCE and the rest of the PCB.

Returning to FIG. 1, the module 100 further comprises a coupling element 105 and an optical connector 106. The optical connector 106 is configured to enable optical access from the exterior of the module 100 to components within the module 100 via the coupling element 105. By optical access, it is meant that optical signals can be injected into the optical module or that optical signals from the optical module can be read out. The optical connector 106 is configured to receive one or more connectorised fibres. For example, the optical connector 106 is configured to receive a single fibre. In another example, the optical connector 106 is configured to receive a LC or Multiple-Fiber Push-on/Pull-off (MPO) connectorised fibre.

The coupling element 105 is configured to optically couple the optical connector 106 to the PIC 101. For example the coupling element 105 may comprise a single optical fibre. The optical fibre array connects to the optical connector 106 at one end, while the other end is optically coupled to the PIC 101 by a suitable optical interfacing means (not shown). A suitable optical interfacing means is configured to couple most of the light between the fibre and the PIC 101, avoid reflections back into the PIC (or into the fibres) and avoid uncontrolled scattering of light inside the module 100. In an example, the optical mode of the optical interfacing matches the optical mode of a light collecting element. Examples include lens off chip, grating couplers, spot size converters, evanescent coupling elements. The fibre can be a flat cleaved fibre, a tapered fibre, lensed terminated and with anti-reflection coating.

In use, the optical module 100 is plugged into an electronic host board 108, which will be described further below. When plugged, the components of the optical module 100 may therefore be electrically connected to the electronic host board. Further, the optical module 100 is optically connected to an external optical link by way of optical connector 106, such that the PIC 101 is optically coupled to the external optical link. During its operation, the temperature of the PIC may vary, for example, due to changing ambient conditions, or as a result of the electrical and optical signals injected or read out of the PIC 101. The TCE 104 is used to actively stabilize the temperature of the PIC 101 by injecting and/or removing heat as required. The above described arrangement of the PIC 101, TCE 104 and housing 102 makes stabilizing the temperature easier.

Furthermore, the assembly of the optical module 100 is simplified because the PIC 101 is mounted onto the TCE 104, via the chip carrier 103*b*, directly into the optical module. The PIC 101 is not first mounted into an optical sub-assembly which is then mounted into the optical module. Thus, the assembly of the module 100 is simplified.

FIG. 2 (*a*) shows a perspective view of the optical module 100 of FIG. 1. Compared to FIG. 1, the PIC 101 and the chip carrier 103*b* are omitted. FIG. 2 (*a*) further shows a lid 115 (shown as a translucent layer). The lid is removable and its purpose is to protect the components housed in the housing 102. In particular, the lid protects the photonic integrated circuit. In FIG. 2(*a*), the lid is shown as a translucent layer. Alternatively, the lid is an opaque layer or transparent layer. The lid does not contribute to heat exchange and may be made of any material. In an example, the lid is made of the same material as the housing 102.

FIG. 2 (*a*) also shows that the electrical plug connector 107 is part of the internal circuit board 103. In other words, the internal board 103 and the electrical plug connector 107 are unitary such that the internal board 103 is pluggable directly into a receptacle connector in the electronic host board. FIG. 2 (*a*) further shows an opening 106*b*. The opening 106*b* is configured to accommodate optical connector 106 (which is not shown in this figure). The optical connector is fixed to the housing in the opening 106*b* this facilitates alignment of fibres to the circuit. For example, if a fibre is connected to the connector and the connector mounted on the housing aperture 106*b* prior fibre alignment then the rigidity of the fibre may affect its handling and its precise alignment to the optical couplers on chip.

FIG. 2(*b*) is a close up view of FIG. 2(*a*) showing the PIC 101, the chip carrier 103*b*, and the internal circuit board 103 in more detail. The TCE 104, provided between the chip carrier 103*b* and the housing 104, is not visible in this view. The internal circuit board 103 comprises temperature control solder holes 111. The purpose of the solder holes 111 is to connect the wiring of the TCE 104 to the top of the internal board 103, for convenience and ease of assembly.

As shown in FIG. 2(*b*), the chip carrier 103*b* comprises temperature sensor mounting pads 113. The mounting pads 113 are for attaching and electrically connecting a temperature sensor onto the chip carrier 103*b*. The temperature sensor is not shown. The temperature sensor may then provide an indication of the temperature of the PIC 101. For example, the temperature sensor may be a thermistor.

FIG. 2(*b*) also shows a red arrow that arrow illustrates the optical input and output to the PIC 101. In practice light is coupled in and out of the PIC 101 by way of coupling element 105, described above.

Figure 3:
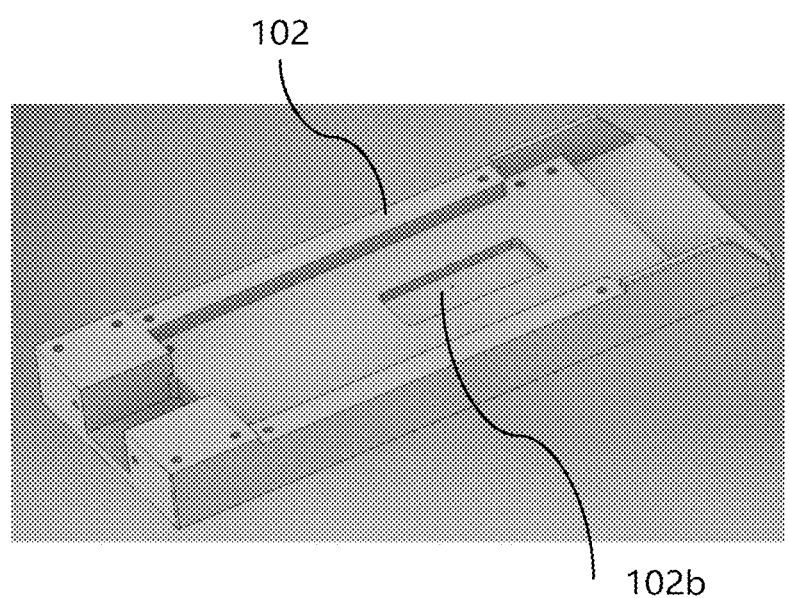
FIG. 3 shows a perspective view of the optical module, showing a housing only.
Figure 4:
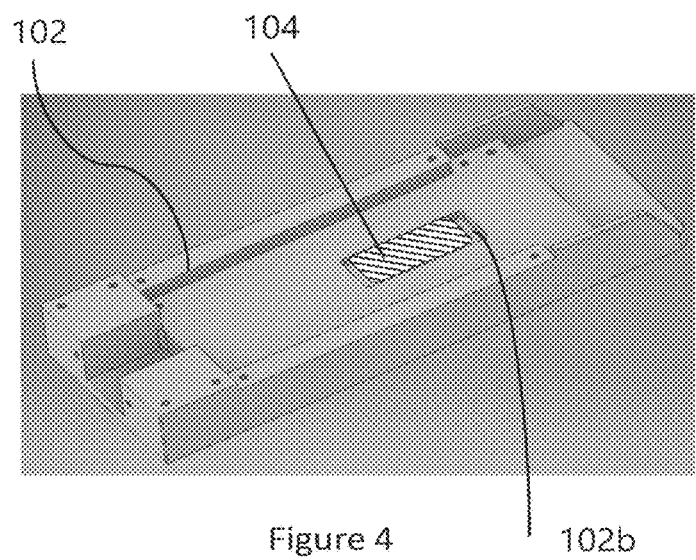
FIG. 4 shows a perspective view of the optical module, showing the housing and a temperature control element.

FIG. 3 shows a perspective view of the housing 102 of optical module 100 from FIGS. 1 and 2. In this figure, all components other that the housing 102 are omitted. The housing 102 is configured to accommodate components such as the TCE 104, the internal circuit board 103, and the PIC 101, as described above. The housing 102 corresponds to the CFP2 form factor. Further, the housing 102 comprises a TCE receptacle 102*b* that is configured to receive the TCE 104. The TCE receptacle 102*b* is configured to adjust the height of the PIC 101 relative to the PCB. The PCB is mounted at a predetermined height inside the housing in order to be able to plug into an electronic host board. The TCE receptacle 102b allows the height of the PIC 101 to be adjusted accordingly. FIG. 4 shows the same view as FIG. 3 with the TCE 104 shown assembled into the receptacle 102b.

Although FIG. 3 shows a housing corresponding to the CFP2 form factor, other form factors may be used.

Figure 5:
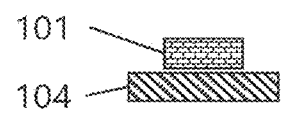
FIG. 5 shows a side view of a photonic integrated circuit attached directly to the temperature control element in accordance with an embodiment.
Figure 6:
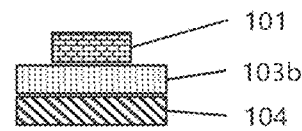
FIG. 6 shows a side view of a photonic integrated circuit attached to the temperature control element via an interposer chip in accordance with another embodiment.

FIG. 5 and FIG. 6 show side views of the photonic chip 101 assembled onto the temperature control element (TCE) 104 such that the chip 101 is in thermal communication with the TCE 104. FIG. 6 shows that the chip 101 is connected to a chip carrier 103b, which is then connected to the TCE 104. FIG. 6 corresponds to the arrangement shown in FIGS. 1 to 4.

FIG. 5 shows an alternative arrangement in which the chip carrier 103b is omitted. In this case, the PIC 101 is attached directly to the TCE 104. The expression 'attached directly' has the same meaning described above in relation to the attachment of the TCE 104 to the housing 102. In this arrangement, electrical contacts on the PIC 101 may be connected to contacts on the internal circuit board 103 by way of wire bonds (not shown).

The following features can be optionally and additionally combined with the optical module described above in relation to FIGS. 1 to 5, or as alternatives to some of the features described.

Additionally and optionally, the housing 102 comprises a heatsink configured to cool the module 100. In an example, the heatsink is provided on the exterior of the housing 102.

Although the description of the module 100 refers to the coupling element 105 as comprising a single optical fibre, it will be understood that, alternatively, the coupling element 105 may comprise a plurality of individual optical fibres. The optical interfacing means may correspond to that of the single optical fibre above. Yet alternatively, the coupling element 105 may comprise an optical fibre array. The optical fibre array may be arranged in a row (1D) or in a rectangular array (2D). The optical interfacing mean may correspond to that of the single optical fibre above. Optionally, the fibre array comprises one or more lensed fibres. The optical interfacing means may correspond to that of the single optical fibre above.

Although, the description of the module 100 refers to the temperature sensor pads 113 being on the chip carrier 103b (as shown in FIG. 2(b)) and hence the temperature sensor being on the chip carrier 103b, it will be understood that alternatively, the temperature sensor is provided on the PIC 101 instead. In this alternative arrangement, the temperature sensor may be a thermistor, such as NTC, PT100, or PT1000, or a resistive sensor fabricated in the PIC 101. By providing the temperature sensor on the PIC 101, a more accurate measurement of the temperature of the PIC 101 may be obtained and the temperature of the PIC 101 may therefore be more easily stabilised.

In an example which is not shown, coupling element 105 and optical connector 106 comprise a micro-LC to LC adapter. Using micro-LC in the module 100 is helpful to reduce the space occupied by the connector. MPO is also useful, when there is high-fibre count.

In an example which is not shown a PCB edge connector is used as an alternative to the unitary electrical plug connector 107 and internal circuit board 103 described above. For example, the connector is a CFP2 edge connector. One end of the PCB edge connector is soldered to the internal circuit board 103, and the other end is configured to be plugged into the electronic host board.

The chip carrier 103b may further comprise some small electronic components such as resistors, capacitors or transimpedance amplifiers. It can also be configure to perform first stage of processing of the signal from the chip. For example a small circuit can be implemented on the chip carrier to subtract the signal from two photodiodes in case the PIC is configured to perform homodyne measurements.

Figure 7:
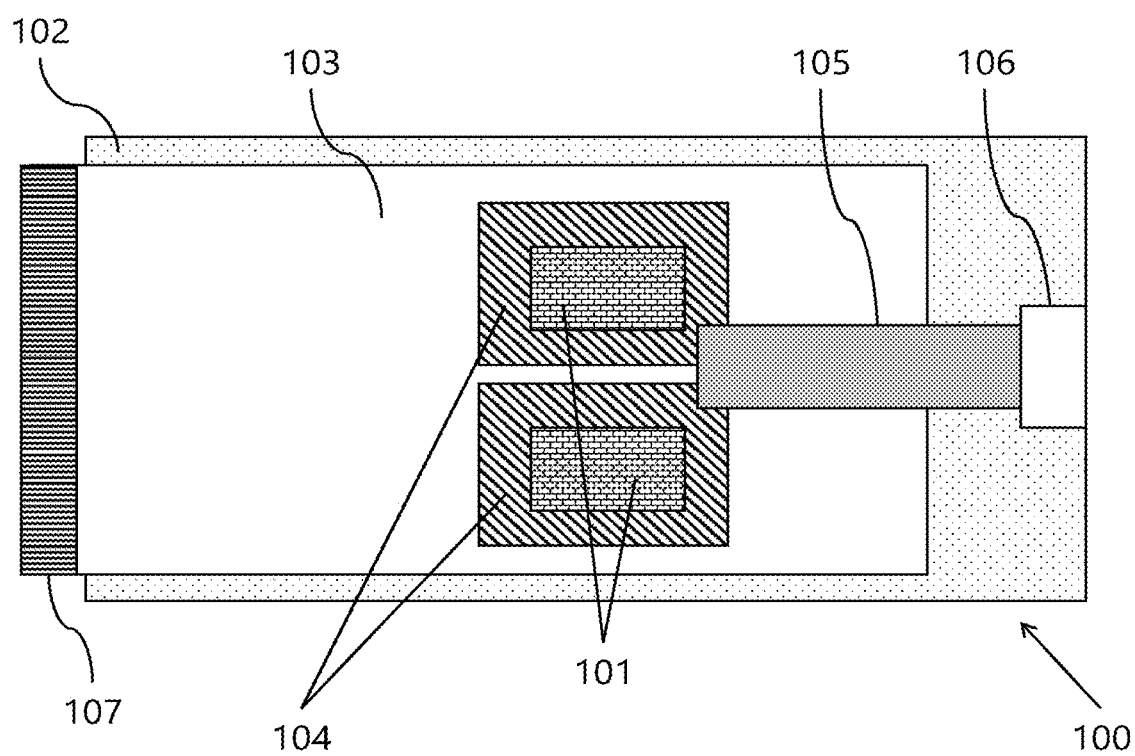
FIG. 7 shows a plan view of an optical module according to another embodiment.

FIG. 7 shows a plan view of an optical module 100 according to another embodiment. The arrangement of FIG. 7 is similar to that shown in FIGS. 1 to 5, except that the module 100 and housing 102 is configured to house two PICs 101. As shown in FIG. 7, each of the PICs 101 is mounted onto a TCE 104, as described in relation to FIG. 5. Note that, alternatively, each of the PICs may be mounted on a chip carrier which is then attached to the TCE, as described in relation to FIG. 6.

Figure 8:
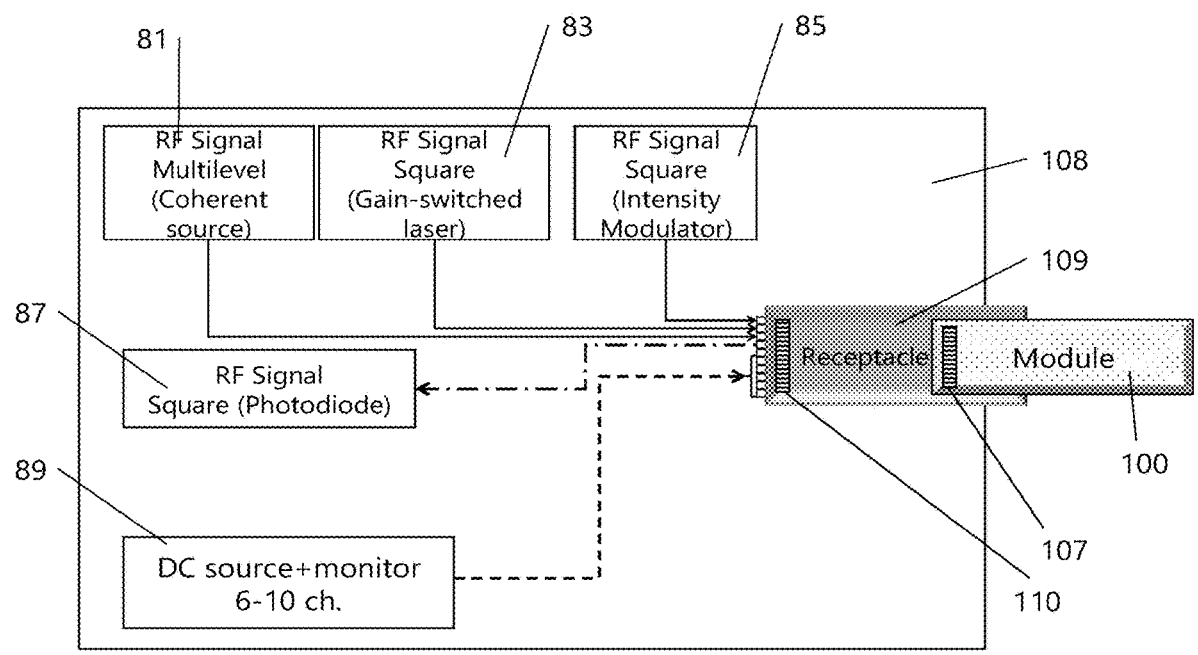
FIG. 8 shows a schematic illustration of system comprising an electronic host board and the optical module in accordance with an embodiment.

FIG. 8 shows a schematic illustration of system comprising an electronic host board 108 and the optical module 100 in accordance with any of the previous embodiments.

The electronic host board 108 comprises a receptacle 109 into which the module 100 is plugged in. The receptacle 109 comprises a receptacle connector 110 that is configured to mate with the electrical plug connector 107 on the module 100 (or alternatively, with the PCB edge connector of FIG. 6 (b)). Thus, when plugged, there is electrical connection between the electronic host board 108 and the optical module 108, via the receptacle connector 110 and the electrical plug connector 107 (or the alternative shown in FIG. 6 (b)). The receptacle connector 110 is also referred to as a socket.

The electronic host board 108 further comprises one or more controllers configured to generate the electronic signals that are then applied into the optical module 100. For example, the host board 108 is configured to generate an RF multilevel signal 81 for a coherent source on the module 100; an RF square signal 83 for a gain-switched laser; and an RF square signal 85 for an intensity modulator. These signals may be applied to components on the PIC 101 (via the electrical connection to optical module 100) to generate optical pulses with well-defined properties.

Figure 9:
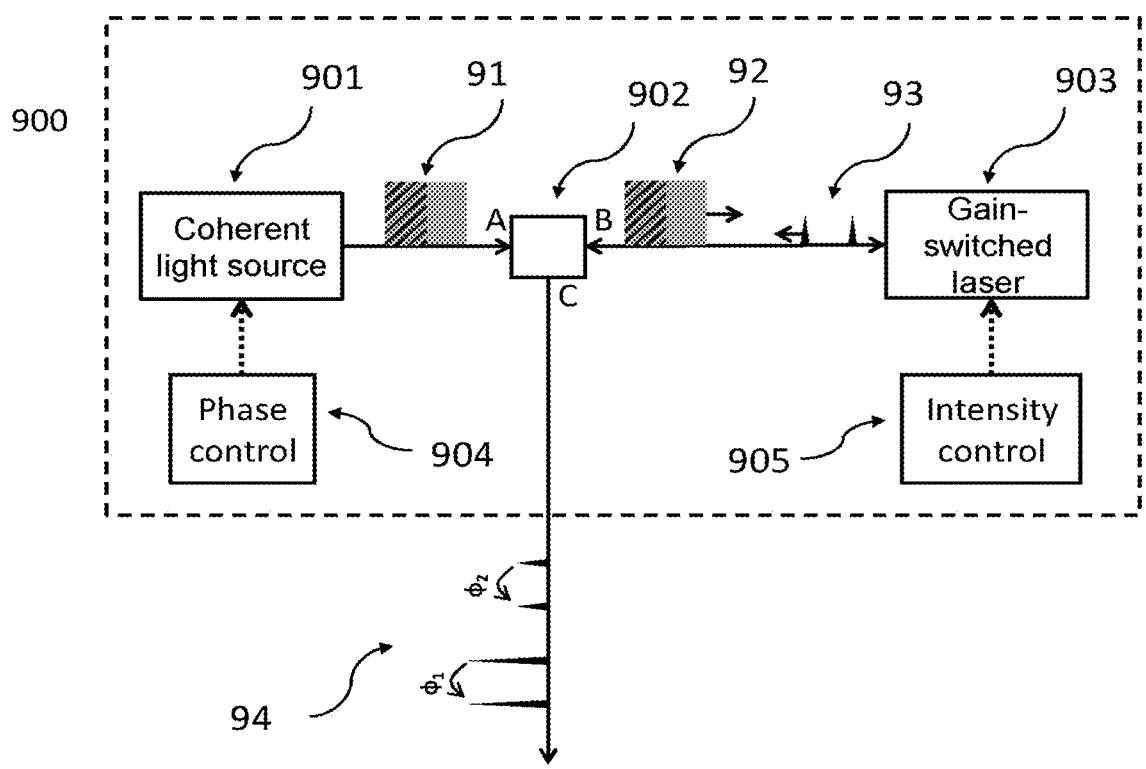
FIG. 9 shows a schematic illustration of an optical light source in accordance with an embodiment, comprising coherent light source and a gain-switched laser.

FIG. 9 shows a schematic illustration of an optical device 900 on the PIC for optical pulse generation. The optical device 900 includes phase modulation and intensity modulation. The optical device 900 may be referred to as a sending unit. In an embodiment, the gain switched laser 903 and the coherent light source 901 are integrated on a substrate, as will be described below. Phase control element 904 applies a perturbation to the coherent light source 901, such that there is a phase difference between the first half of long light pulse 91 and the second half of long light pulse 91. Long light pulse 91 enters light distribution device 902 through port A. However, in alternative embodiments, light distribution device 902 is omitted, and long light pulse 91 travels directly from coherent light source 901 to gain-switched laser 903.

The phase control element 904 applies a perturbation to the coherent light source 901 at regular intervals, which are timed to occur halfway through the generation of each long light pulse 91. The perturbation changes the phase of the second half of the light pulse, producing a phase difference between the first half of a light pulse and the second half of the light pulse. The perturbation is controlled, in other words, the same perturbation will always cause the same phase shift. The amplitude of the perturbation that is applied affects the phase shift that is generated. In one embodiment, the perturbation is a short current pulse.

Alternative embodiments comprise an optical amplifier, for example a semiconductor optical amplifier instead of a gain-switched laser 903. Further alternative embodiments comprise an intensity modulator instead of a gain-switched laser 903. An intensity modulator modulates the intensity of incoming light pulses. In an "off" state, the intensity modulator reduces the intensity of the light to a low level. In an "on" state, the intensity modulator allows a larger fraction of the incoming light to exit. The intensity modulator is switched between an "on" state and an "off" state twice when the light pulse 91 from the coherent light source is present in order to generate two short light pulses 94. When the intensity modulator is used instead of the laser 903, the intensity control element 905 provides the switching signal; in this case, the RF signal intensity 85 for the intensity modulator corresponds to the switching signal. The phase difference between the two short light pulses is determined by the phase applied to the coherent light pulse 91 by the phase control element 904. An intensity modulator may modulate the intensity of the light by changing the absorption coefficient of the material in the modulator, for example an electro-absorption modulator. An electro-absorption modulator is a semiconductor device for which the voltage applied to the device changes the absorption coefficient, and therefore the intensity of light travelling through the device. In another embodiment the intensity modulator is based on a Mach-Zehnder interferometer. A Mach-Zehnder based intensity modulator changes the phase difference between the two arms of the interferometer to modulate the output intensity.

Long light pulse 92 exits light distribution device 902 through port B, and is injected into gain-switched laser 903. Intensity control element 905 controls the current applied to gain-switched laser 903, in order to modulate the intensity of the double pulses 93 emitted from the gain-switched laser 903. The double pulses 93 are emitted from the same aperture through which long light pulse 92 was injected, and enter light distribution device 902 through port B. The double pulses exit light distribution device 902 through port C. The first pair of light pulses that exit port C of light distribution device 902 have an intensity that has not been modulated by the intensity control element 905, and the phase difference between the pulses is $\phi_1$. The second pair of light pulses that exit port C of the light distribution device 902 have an intensity that has been reduced by intensity control element 905. The phase difference between the pulses is $\phi_2$.

Figure 10:
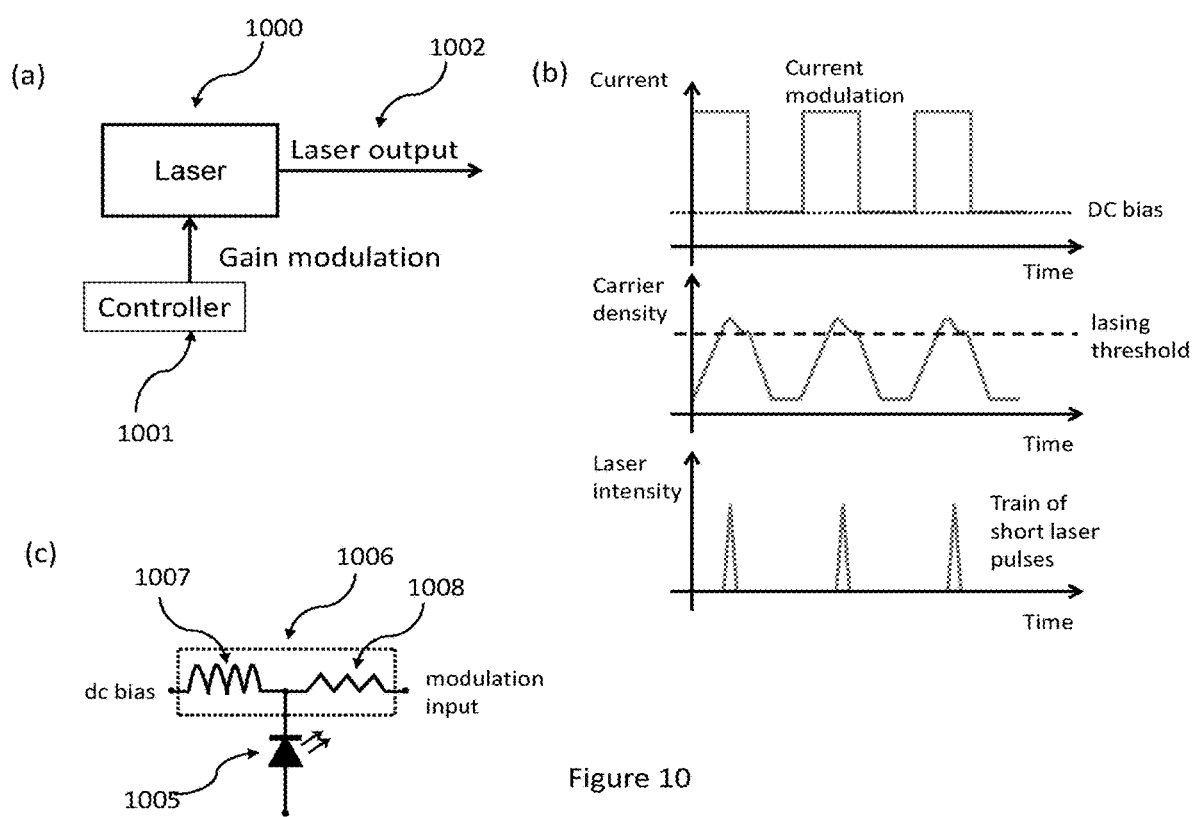
FIG. 10 is a schematic illustration of an electrical driving circuit for a semiconductor gain-switched laser.

Gain switching will now be described with reference to FIG. 10. FIG. 10(a) shows a schematic illustration of a gain-switched semiconductor laser. A gain-switched laser generates light when the laser is switched above the lasing threshold and generates almost no light when the laser is switched below the lasing threshold. Laser 1000 has a controller 1001 which allows modulation of the gain of the laser by modification of the pump power. The gain can be modulated in a time varying manner. Driving the laser in this manner can generate short laser pulses (of the order of picoseconds in duration) at the laser output 1002.

When laser 1000 is a semiconductor laser then it can be pumped electrically, by applying a current. In order to modulate the gain of a semiconductor laser, the controller 1001 modulates the current applied to the laser.

FIG. 10(b) shows three graphs illustrating a gain modulation of a semiconductor gain-switched laser. The upper graph shows the current applied to the laser on the vertical axis, with time on the horizontal axis. The DC bias is indicated by a horizontal dotted line. The current applied to the laser has the form of a series of current modulation pulses. The wave is a square-type waveform. In this case, the current is not reduced to zero in between the current modulation pulses, but only reduced to a bias value (which is indicated by the dotted line).

The current modulation signal is applied to the laser and switches the gain of the laser above and below the lasing threshold periodically. The second graph shows the carrier density of the laser on the vertical axis, against time on the horizontal axis. The lasing threshold is indicated by a dashed horizontal line. When a current modulation pulse is applied to the laser, the injected carriers increase the carrier density and the photon density increases.

The laser output generated by the modulation signal is shown in the lower graph. The vertical axis shows the laser intensity, with time on the horizontal axis. The laser outputs light when the carrier density is above the lasing threshold. Photons generated by spontaneous emission inside the laser cavity are amplified sufficiently by stimulated emission to generate an output signal. The length of the delay between the application of the current modulation pulse and the generation of the output light depends on several parameters, such as the laser type, cavity length and pumping power.

The rapid increase of the photon density causes a decrease in the carrier density. This in turn decreases the photon density, which increases the carrier density. At this point the current modulation pulse is timed to switch back down to the DC bias level, and the laser emission dies off quickly. The laser output therefore consists of a train of short laser pulses as shown in the lower graph.

FIG. 10(c) shows a schematic illustration of an electrical driving circuit for a semiconductor gain-switched laser. The semiconductor gain-switched laser is laser diode 1005. The cathode of laser diode 1005 is connected to bias-T 1006 comprising inductor 1007 and resistor or capacitor 1008. Via inductor 1007 a DC bias current is sent through the laser diode. This provides the gain bias (the minimum level of the current indicated by the dotted line in FIG. 10(b)). Via resistor or capacitor 1008 an AC modulation current is sent through the laser diode, providing the gain modulation needed for gain-switching the laser above and below the lasing threshold. In this case, the modulation input to the bias-T 146 is provided by controller 1001.

Returning to FIG. 8, the RF multilevel signal 81 for a coherent source on the module 100; the RF square signal 83 for a gain-switched laser; and the RF square signal 85 for an intensity modulator will now be described, with further reference to FIGS. 9 and 11.

FIG. 11(a) shows the current signal 81 applied to the coherent light source 901 when modified by phase control element 904. The current signal 81 comprises a series of square type pulses, where the duration of the periods between the pulses is shorter than the duration of the pulses. The square type signal can be formed by combining an AC current with a DC bias current via a bias-T. The current signal 81 further comprises a smaller current pulse that is added to the above square type signal through the AC input of the bias tee. The smaller current pulse is timed such that it coincides with the mid-point of the upper section of one of the square pulses. The phase control element can be a separate element that generates the smaller current pulses, which are then combined with the square pulse AC signal. The square pulse AC signal is configured such that the duration of the periods between the pulses is shorter than the duration of the pulses. The smaller current pulse can be formed by combining an AC current with a DC bias current via a bias-T. The combined signal is then inputted to the AC input of the bias tee. The smaller current pulse of the current signal 81 correspond to the perturbation that imparts a controllable phase sift to the light pulse 91, as described in relation to FIG. 9.

Figure 11:
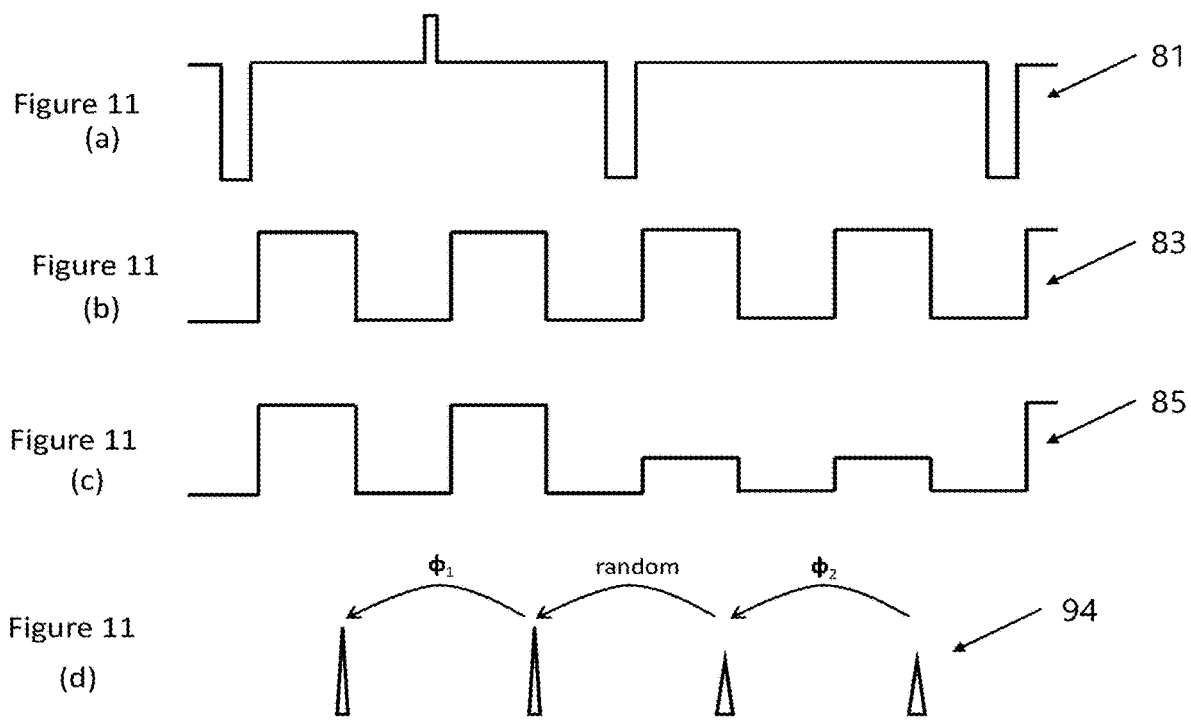
FIG. 11 (a) shows the time varying current applied to the coherent light source by a phase control element.

FIG. 11(*b*) shows the time varying current 83 applied to gain-switched laser 903 by a controller. The signal comprises a square wave, of a magnitude such that the gain-switched laser 903 is switched periodically above the lasing threshold. The first current pulse is applied when the first half of light pulse 92 is present. The first current pulse is timed such that the gain-switched laser 903 is switched above the lasing threshold during the section of the time when the first half of light pulse 92 is present in the gain-switched laser. The second pulse is timed such that the gain-switched laser is switched above the lasing threshold during the section of the time when the second half of the light pulse 92 is present in gain-switched laser 903. The time varying current applied to the coherent light source 901 and the time varying current applied to the gain-switched laser can be synchronised in order that the timing of the generation of the short pulses corresponds to the time when the correct section of the long light pulse is present. For example, both time varying currents can be synchronised to a master clock signal.

FIG. 11(*c*) shows the time varying current 85 after modification of the signal 83 shown in FIG. 11 (*b*) by the intensity control element 905. The modified signal is then inputted to the AC input of a bias tee and the output current of the bias-T is applied to the gain-switched laser 903. For a decoy-state BB84 protocol, it may be required that 1% of the coherent double pulses are vacuum pulses, 2% of the coherent double pulses are decoy pulses and 97% of the coherent double pulses are signal pulses. The combined signal is generated such that each pair of electrical pulses applied to the gain-switched laser has a 1% probability of having zero amplitude (i.e. such that no short pulses are generated), a 2% probability of having a reduced amplitude, and a 97% probability of having an unmodified amplitude. A portion of the combined signal is shown in FIG. 11(*c*). The signal of FIG. 11(*b*) has been modified such that one pair of electrical pulses has a reduced amplitude. When this pair of electrical pulses is applied to the gain-switched laser 903 a coherent double pulse with a reduced intensity is generated. FIG. 11(*d*) shows the light pulses emitted from the gain-switched laser 903.

Note that the bias T circuit 1006 described above in relation to FIG. 10(*c*) may be provided in the electronic host board 108, or alternatively on the internal circuit board 103 of the optical module 100.

Returning to FIG. 8, an RF square signal 87 is read out from a photodetector integrated on the PIC 101 provided in the module 100. The RF square signal 87 may correspond to signals read out by a receiver (containing the photodetector) on the PIC 101.

Alternatively, the RF square signal 87 read out from the photodetector is coupled to an analog-to-digital converter (ADC). Optionally, the ADC is further coupled to a post processor. The ADC and, optionally the post processor, may be used to extract information relating to photons received at a photodetector on the PIC 101. For example, the post processor may convert raw data from the ADC in order to extract a sequence of random numbers, when optical pulses arriving at the photodetector have random intensities.

The electronic host board 108 further comprises a DC source and a monitor 89. The DC source 89 outputs one or more DC output signals. In an example, the DC source has between 6 and 10 output channels. In an example, the DC signals are high stability voltages or currents. The DC signals may be used to as dc bias in the bias-T 1006, as described above.

The electronic host board 108 may further comprise a controller for the temperature control element (not shown). In an example, the controller comprises a feedback loop for servo control of the TCE via electric signals. The controller monitors the resistance of the thermistor and provides feedback parameter such that the current through the TCE is adjusted accordingly. In an example the electric signal generated is a high precision signal. In an alternative example, the controller is provided in the optical module instead.

Figure 12:
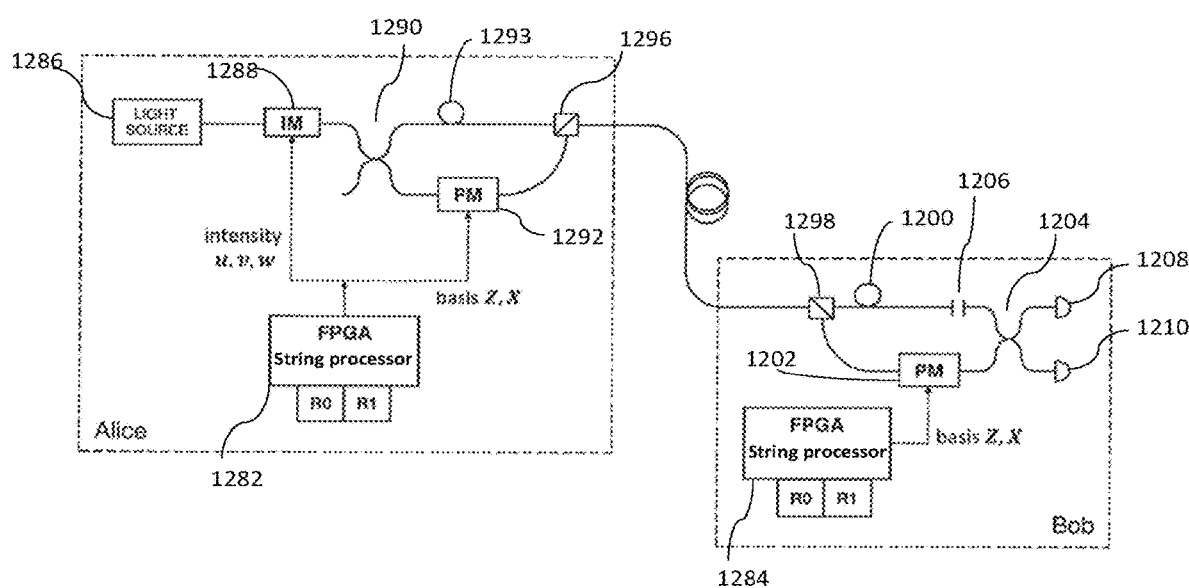
FIGS. 12 (a) to 12 (c) shows a schematic illustrations of a quantum key distribution (QKD) system according to embodiments.
Figure 12:
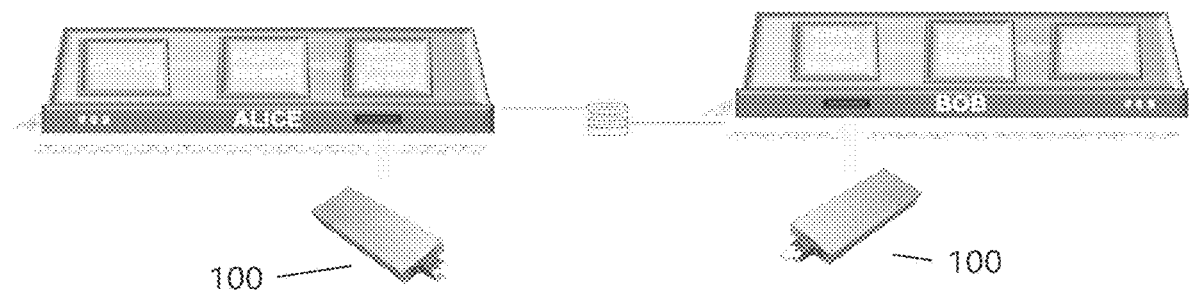
Figure 12:
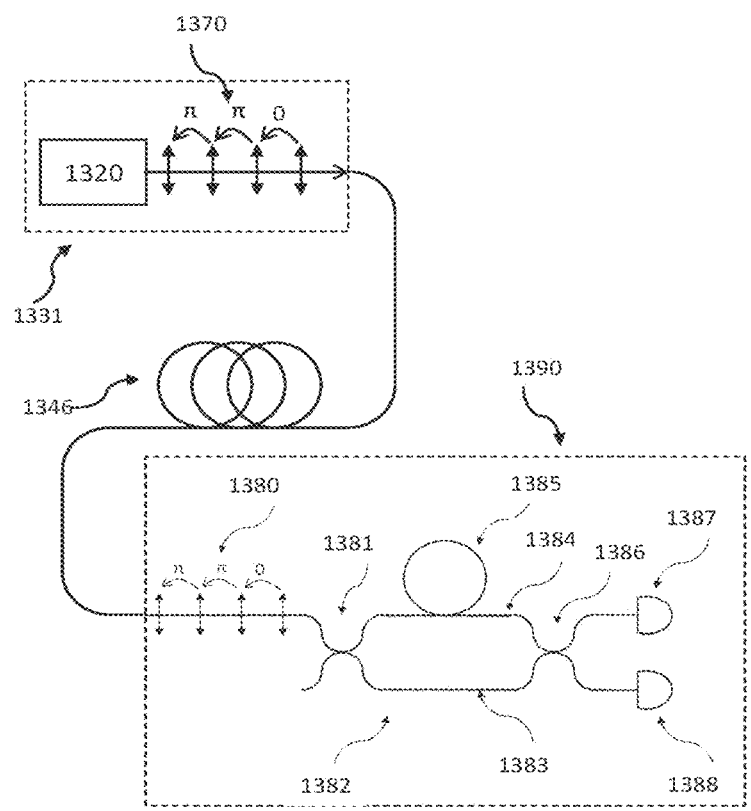

FIG. 12 (*a*) shows a schematic illustration of a Quantum Key Distribution (QKD) system. QKD allows two parties to create and share a random secret key, or cipher, in a secure manner using quantum bits, or qubits. QKD theoretically allows the sender (often referred to as "Alice") and receiver (often referred to as "Bob") of the key to tell if an eavesdropper (often referred to as "Eve") has intercepted the communication, compromising the key's security. This relies on the fact that a qubit cannot be measured without affecting the measured property. As such, any such alteration of the received qubits due to Eve's interference can be detected by Alice and Bob.

A quantum bit may be encoded in a light pulse or in a single-photon pulse. A quantum bit source may be a source of light pulses or of single photons. A source of light pulses may be implemented according to the embodiments described herein.

The QKD system may use light. Embodiments disclosed herein may control the light intensity values. Embodiments disclosed herein may control the encoding and/or decoding bases prescribed by the QKD protocol. A particular example may be the BB84 protocol with decoy states, wherein an embodiment according to the present disclosure may output three values: u, v and w, which may correspond to a "signal", "decoy" and "vacuum" state, respectively. It may be desirable for each of these output values to occur with a different output frequency. As such, a string processor as described herein may be used in such a QKD system. Another example is the so-called "efficient BB84 protocol" where in, an embodiment, two bases, Z and X, may be used. These bases can be selected with different occurrence probabilities. As such, a RNG as described below may be used. It is also possible to have jointly an efficient BB84 protocol with decoy states. In this case, multiple output symbols (Zu, Zv, Zw, Xu, Xv, Xw) have to be selected with different probabilities and the RNG described below may be used.

The QKD system comprises two field programmable gate array (FPGA) string processors 1282 and 1284 in the sending unit (Alice) and receiving unit (Bob).

In FIG. 12 (*a*), a QKD setup to implement the standard or the efficient version of the decoy-state BB84 protocol is depicted. The embodiment of FIG. 12 illustrates a sender, Alice, sending an encrypted key to a receiver, Bob. A light source 1286, or photon source, generates a light pulse which is then passed through an intensity modulator 1288. The intensity modulator 1288 implements the decoy-state method, wherein each light pulse or photon is randomly modulated to one of a number of predetermined intensities $\{u, v, w\}$, corresponding to "signal", "decoy" or "vacuum", respectively; and these predetermined intensities occur with an occurrence frequency determined by the user $\{f_u, f_v, f_w\}$. A string processor, or FPGA string processor 1282 according to an embodiment is used to control the intensity modulator 1288, providing three outputs (each corresponding to a certain intensity) with a quality-assured level of randomness and with a predetermined bias.

The intensity-modulated pulses are then split by an input beam splitter 1290. One path—the "first path"—goes through a phase modulator 1292 after the beam splitter 90. The phase modulator 1292 randomly modulates the photons by a specific phase, thus outputting the photons with one of (in this embodiment) two bases {Z, X}. The occurrence ratio between the two bases may be biased or unbiased, and predetermined by a user. In the former case, the efficient version of the BB84 protocol is realized; in the latter case, the standard version of the BB84 protocol is realized. The invention disclosed herein can cover both cases, with the unbiased case as a trivial particular case. A string processor, or FPGA string processor 1282 according to an embodiment is used to control the phase modulator 1292 for the basis selection. The FPGA 1282 controlling the basis selection in the phase modulator 1292 of FIG. 12 is equivalent to the FPGA 1282 that controls the intensity modulator 1288. Alternatively, a different string processor or FPGA according to an embodiment may be used to control the phase modulator 1292.

The second path from the input beam splitter 1290 is sent through an optical delay 1293.

Light pulses or photons from the first and second path are then sent to the receiver, Bob, via an optical transmission line 1294 and two polarising beam splitters 1296 and 1298. Alice's polarising beam splitter 1296 rotates and combines polarised pulses or photons from the two different paths and send them through the optical transmission line 1294. As the pulses or photons are polarised, Bob's polarising beam splitter 1298 separates them and directs them onto the two paths of his interferometer, this time sending the pulses or photons sent through Alice's phase modulator 1292 through an optical delay 1200 and the pulses or photons not sent through Alice's phase modulator 1292 through phase modulator 1202. This way, the pulses or photons can reach the final beam splitter 1204 at the same time and can interfere.

Bob's phase modulator 1202 randomly selects one of two bases in which to measure the received pulses or photons, by selecting a phase modulation value. Similar to Alice's phase modulator 1292, Bob's phase modulator 1202 randomly modulates the photons by a specific phase, thus effectively measuring through the detectors 1208 and 1210 the photons with one of (in this embodiment) two bases {Z, X}. The occurrence ratio between the two bases is biased, and predetermined by a user to be equal to that of Alice's phase modulator 1292. A further string processor or FPGA string processor 1284 according to an embodiment may be used to control this second phase modulator 1202 for the basis selection.

The two paths in the receiver are then again combined at the output beam splitter 1204. To ensure the two optical delays 1293 and 1200 combine to ensure that both overall paths experience the same delay, a variable delay line 1206 fine tunes the delay in the receiver.

Photon detectors 1208 and 1210 are then used to measure the result of the interference between the pulses or photons on the two paths; and from these results the key may be derived. For example, the key bit value 0 can be assigned if detector 1208 clicks while the key bit value 1 can be assigned if detector 1210 clicks.

In the above, Alice's phase modulator 1292 and Bob's phase modulator 1202 are configured to encode and decode quantum bits respectively.

Random numbers can be produced from Random Number Generators (RNG). In particular, Quantum Random Number Generators (QRNG) may be used. In QRNG, the source of randomness is physical and relies on the unpredictability of a measurement, and, in particular, the unpredictability relies on a quantum mechanical property. QRNGs can be implemented using gained-switched diode lasers. In gain-switched diode lasers, the lasing threshold is governed by spontaneous emission, which is a quantum mechanical process, such that the phase of the emitted pulse is random. By repeatedly switching the diode laser on and off, a stream of optical pulses, each having a random phase, can be generated. By measuring the random phase of each optical pulse in the stream of optical pulses, a sequence of random numbers can be obtained.

At least some of the components of the QKD system of FIG. 12 (*a*) are implemented on the PIC 101 provided in the optical module 100.

In the sending unit (Alice), the light source 1286 may be implemented on PIC 101 using the emitter described in FIG. 17 below.

Phase modulator 1292 is implemented as an electro-optic modulator, wherein the refractive index of the material is a function of applied electric field. Changes in refractive index result in changes in optical path length and results in changes in the phase shift applied by phase modulator. Different voltages are applied to the phase modulator so as to impart a different phase shift. A phase modulator such as described can comprise a crystal, such as a LiNbO3 crystal, in which the refractive index is a function of electric field strength, and an electric field may be applied by applying a voltage to electrodes positioned around the LiNbO3 crystal. Alternatively, the phase modulator 1292 is implemented as a traveling-wave modulator, or using piezo electric actuator.

The intensity modulator 1288 may be implemented as a Mach Zehnder Interferometer MZI switch. The MZI switch is configured to operate as a variable optical attenuator. The MZI switch has two inputs and two outputs. However a single input and/or a single output may be used. At the input side, the inputs are evanescently coupled together and then split into two arms of the interferometer. One arm contains a phase shifter. The phase shifter is configured to add a phase to the input light and the amount of phase added may be controlled. The phase shifter may be implemented in the same manner as for phase modulator 1292. The light passing through the phase shifter interferes with the light that has not passed through the phase shifter and the amplitude of the light at each output of the MZI depends on the relative phase shift. By dynamically adjusting the phase shift of the phase shifter, the power splitting ratio may be controlled and the power transferred to each output may be controlled. Thus, the intensity of light output by the intensity modulator 1288 may be controlled. Alternatively the intensity modulator 1288 may be implemented as an electro-absorption modulator (EAM).

The beam splitter 1290 is implemented as a 2×2 directional coupler; and the delay 1293 is implemented as a delay line, comprising a light guiding section. In an example, the light guiding section is a few centimetres long. In another example, when the light guiding section is based on InP, the line is approximately 4.5 cm long and provides a delay of approximately 500 ps. The different components are optically coupled together by means of light guiding sections integrated on the PIC 101. The polarising beam splitter 1296 may be implemented off chip.

In a further embodiment, the transmitter 900 of FIG. 9 is used as the sending unit. This can be driven unit the driving scheme of FIG. 11 and this removes the need of electro optic modulator. Removing the electro-optic modulators is a way to reduce the power consumption of the chip and it also allows to make the chip more compact. The removal of the electro-optic modulator also simplifies the electronics on the host board.

Figure 16:
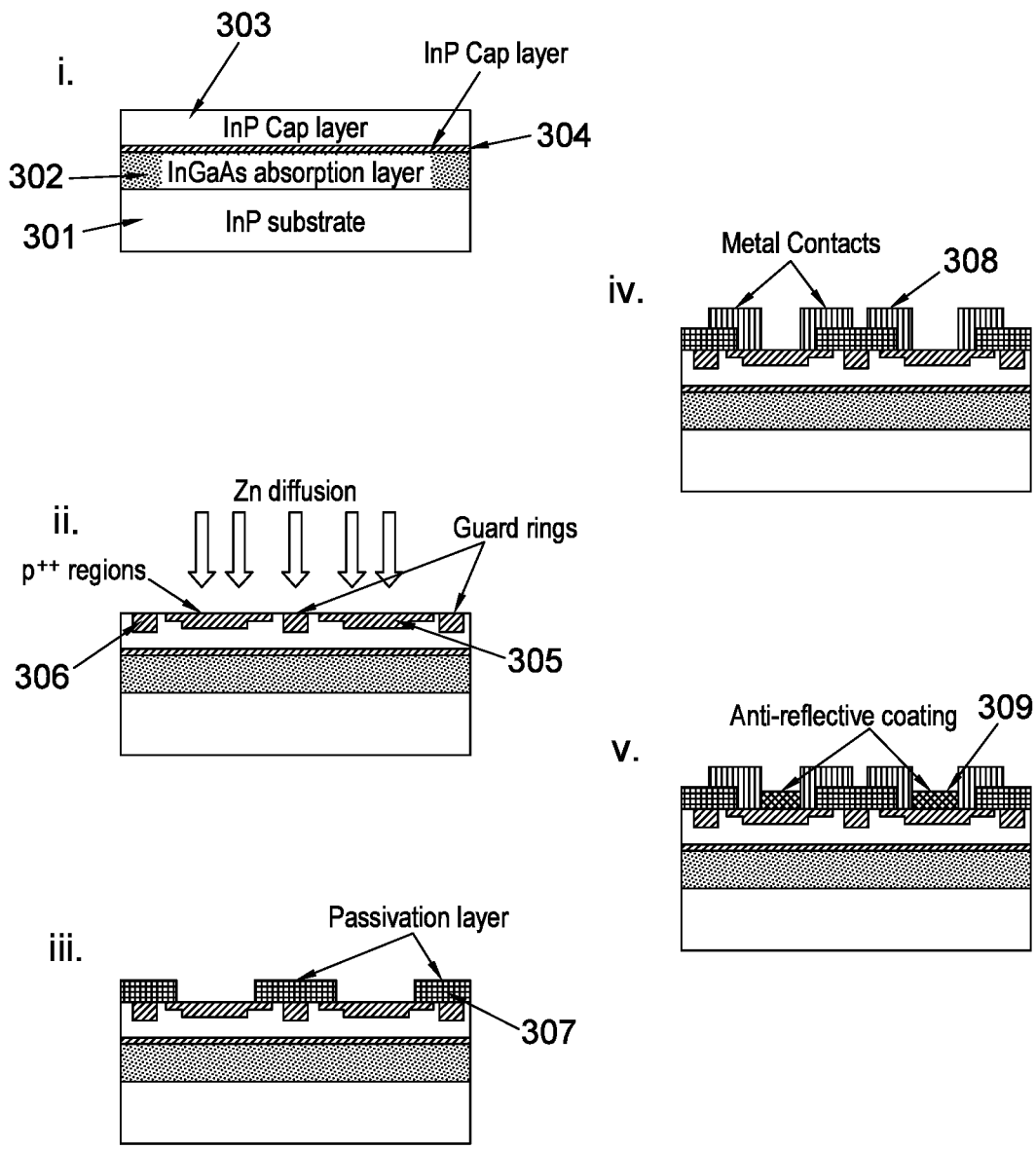
FIG. 16 is a schematic of a receiver that can be used with the systems of the embodiments described herein.

In the receiving unit (Bob), the photo detectors 1208 and 1210 is may be implemented on PIC 101 using the receiver described in FIG. 16 below. Polarising beam splitter 1298, delay 1200, beam splitter 1204 and phase modulator 1202 are implemented in a similar manner as for the sending unit. The variable delay line 1206 may be implemented off chip.

The FPGA 1282 and 1284 are connected to the electronic host board 108 and provide the RF signals for the intensity modulator and the phase modulators. QRNGs provide strings to the string processor (FPGA board) to generate the qubit states.

FIG. 12(*b*) shows a schematic illustration of a Quantum Key Distribution (QKD) system. The QKD system comprises an optical module 100, configured as a transmitter, plugged into a host board (Alice), and another optical module 100, configured as a receiver, plugged into a host board (Bob). The module 100 is compatible with different designs and different QKD protocols. In an example, the same host electric board may drive different quantum transmitters. The same transmitter can be used to generate qubits for one or more protocols (BB84, DPS, COW, SARG, RFI, MDI-QKD, TF-QKD . . . ).

The receiver may also be compatible with multiple protocols if for example it is implemented as in GB2564446B.

FIG. 12(*c*) is a schematic illustration of a differential-phase shift quantum communication system (DPS-QKD) in accordance with an example, where the Quantum Transmitter comprises an optical device 1320 with a phase control element such as that shown in FIG. 9.

A schematic illustration of optical device 1320 is shown in FIG. 9. Coherent light source 901 is a semiconductor laser. Coherent light source 901 is configured to generate CW light. In alternative embodiments, the coherent light source generates long light pulses of duration greater than or equal to 10 ns. In order to encode information, phase control element 904 may apply a short current pulse to coherent light source 901. This results in a phase difference between a first part and a second part of the CW light. The CW light enters gain-switched laser 903, which generates a first short pulse when the first part of the light is incident, and generates a second short pulse when the second part of the light is incident. There is a phase difference between the generated short light pulses equal to the phase difference between the first part and second part. The phase control element 904 encodes information between consecutive pulses by controlling the phase difference between parts of the generated CW light. In this DPS-QKD example, the intensity control element 905 of FIG. 9 is not used.

The phase control element 904 is configured to introduce a phase shift of either 0 or π between subsequent pulses to generate the sequence of light pulses 1370. For the pulses shown in FIG. 12 (*c*), phase control element 904 applies no short current pulse to coherent light source 901 initially, resulting in no phase difference between the first part and the second part of the CW light, and thus no phase difference between the first and second short light pulses. At the next regular interval, phase control element 904 then applies a short current pulse to coherent light source 901, resulting in a phase difference of π between the second part and the third part of the CW light, and thus a phase difference of π between pulse 2 and 3. At the next regular interval, phase control element 904 applies a short current pulse of a particular amplitude to coherent light source 901, resulting in a phase difference of π between the third and fourth part of the CW light, and thus a phase difference of π between pulses 3 and 4 in the sequence. A phase difference of 0 between subsequent pulses is associated with a bit value of 0. A phase difference of π between subsequent pulses is associated with a bit value of 1.

In other words, the phase control element 904 may set the differential phase between subsequent light pulses. For example, a phase difference of 0 between subsequent pulses may be associated with a bit value of 0, while a phase difference of π between subsequent pulses may be associated with a bit value of 1. The light pulses are transmitted to a quantum receiver (Bob) which detects the phase difference between the coherent pulses received and decodes a bit value of 0 or 1. The security of DPS stems from the fact that if an eavesdropper Eve ties to measure one pulse, she destroys the coherence between that pulse and its neighbour and this can be detected by Alice and Bob.

In an embodiment, the coherent light source 901 is turned off periodically to randomise the phase after each qubit emission cycle which is required by some quantum communication protocols, for example, the BB84 protocol. An example operation is shown in FIG. 11(*a*). The coherent light source 901 emits long coherent light pulses. The gain switched laser 903 is driven with two subsequent pulses during the time that a long coherent pulse is emitted by light source 901, generating a time-bin encoded qubit. The relative phase φ1 of the two time-bins encode a desired qubit state, for example, according to the DPS-QKD protocol described above. The system described herein can be configured as required for the different protocols. For example, 2 phase states are used in the DPS protocol, and 4 phase states for the BB84 protocol. For the DPS protocol phase randomisation is not needed. For decoy states protocols the further intensity modulator is needed. The encoded qubits are then sent to Bob.

Quantum receiver 1390 (Bob) is described below. Quantum Transmitter 1331 and Quantum Receiver 1390 are connected by an optical transmission line 1346.

In the embodiment of FIG. 12(*c*), the quantum receiver 1390 comprises an asymmetric MZI 1382 with an optical delay 1385 which is equal to the time delay Δt between two subsequent pulses of coherent pulse sequence 1370. However, it should be noted that the delay line is optional. When a transmitter 900 of the type shown in FIG. 9 is used, there is no delay line in the transmitter 900 and hence the delay between the two pulses can be freely adjusted to match the delay of the receiver. Therefore a variable delay line is not needed in the receiver when using a transmitter 900.

The pulse sequence 1380 enters one input of beam splitter 1381. A first output of input beam splitter 1381 is connected to the long arm 1384 of the interferometer 1382, and a second output is connected to the short arm 1383 of the interferometer 1382. A first fraction of each pulse of the pulse sequence 1380 is sent along the short arm 1383 of interferometer 1382 and a second fraction is sent along the long arm 1384 of interferometer 1382. The long arm 1384 is connected to a first input of output beam splitter 1386 and the short arm is connected to a second input of output beam splitter 1386. At the output beam splitter 1386 subsequent pulses of pulse sequence 1380 are overlapped in time. For example, a second fraction of the first light pulse (which has travelled the long arm 1384) will arrive at the output beam splitter 1386 at the same time as a first fraction of the second light pulse (which has travelled the short arm 1383).

The pulses are coherent and therefore they interfere at the beam splitter. The output depends on the phase difference. If the phase difference is zero there is a detection at detector 1387. If, on the other hand, the phase difference is π, there is a detection at detector 1388. For any other value of difference between the phase modulation applied at the phase modulator, there will be a finite probability that a photon may output at detector 1387 or detector 1388.

The phase difference between the second fraction of the first light pulse and the first fraction of the second light pulse is zero, therefore detector 1387 registers a detection. This corresponds to a bit value of 0. The phase difference between the second fraction of the second light pulse and the first fraction of the third light pulse is π, therefore the detector 1388 registers a detection. Both the fractions of each light pulse interfere and can give rise to a detection. Specifically, the second fraction of the nth pulse can always interfere with the first fraction of the (n+1)th pulse and result in a detection. This happens because each pulse is coherent with the following one. Which detector registers a detection depends on whether the phase value is 0 or π. At the receiver the temperature of the PIC is also stabilised to maximize the interference visibility.

Although the explanation refers to fractions of the light pulses, for an application in which the pulses have on average less than one photon per pulse, each photon will either go along the long arm or the short arm. In these cases, a photon detected at any detector cannot lead to a detection event in any other detector.

In some embodiments in which the optical device is used in a quantum communication system, an attenuator reduces the intensity of the light pulses emitted from the optical device. In some embodiments, the intensity is reduced such that the light pulses comprise 10 or fewer photons. In some embodiments, the average number of photons per pulse is less than 1.

Figure 13A:
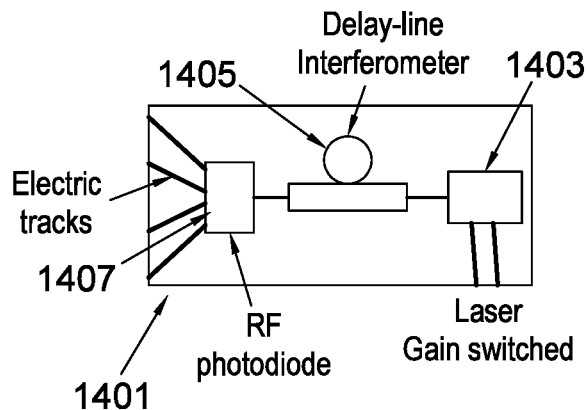
FIGS. 13(a), 13(b) and 13(c) are schematic illustrations of a quantum random number generator according to embodiments.
Figure 13B:
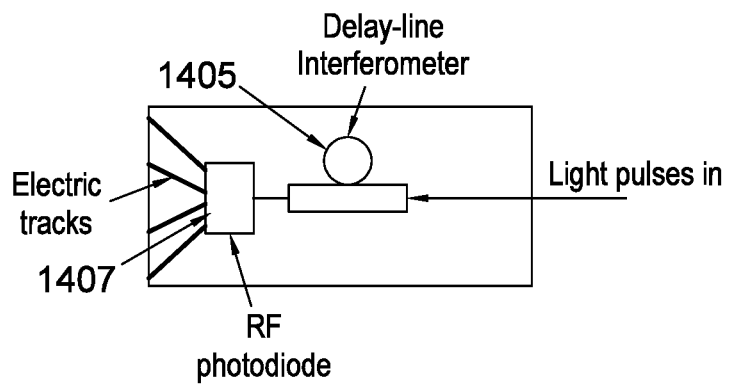
Figure 13C:
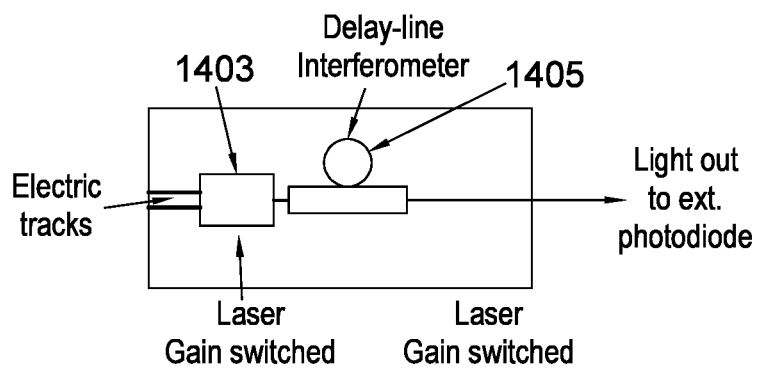

Alternatively, the PIC 101 is configured as other quantum devices. FIGS. 13(*a*) to (*c*) and FIGS. 14(*a*) to (*c*) show examples of the PIC 101 configured as a quantum random number generator (QRNG)

FIG. 13(*a*) shows a PIC 1401 that comprises: a gain-switched laser 1403; a time delay interferometer 1405, which is also referred to as an asymmetric Mach Zehnder interferometer (AMZI), and a photodetector 1405. The gain-switched laser 1403 is configured to produce pulses that each have a random phase in relation to one another, as described herein. The pulses are directed to the AMZI 1405 via light guiding sections (not shown). The AMZI is similar to the MZI described above except that the long arm comprises a delay element. The delayed and non-delayed pulses are caused to interfere in a 2×2 directional coupler in the AMZI and the interfered pulses are directed to the photodetector 1407 where the intensities of the interfered pulses are converted to a signal. The signal corresponding to the intensities of the interfered pulses has a random value because the phases of the reference and delayed pulses are random. Random numbers may be generated from the random intensities of the interfered pulses. Here the photodetector may be on chip (integrated in the PIC 101) as shown in FIGS. 13(*a*) and 13(*b*) or off chip as shown in FIG. 13(*c*). If off chip, the optical interface 105, 106 of the module 100 is used to couple light from the PCI 101 to the photodetector provided off the chip. If on chip, the electrical interface of the module is used to read out the measured intensities. The gain switched laser may be on chip (integrated in the PIC 101) as shown in FIGS. 13(*a*) and 13(*c*) or off chip as shown in FIG. 13(*b*). If off chip, the optical interface 105, 106 of the module 100 is used to couple light from the gain switched laser provided off the chip to the PIC.

Figure 14A:
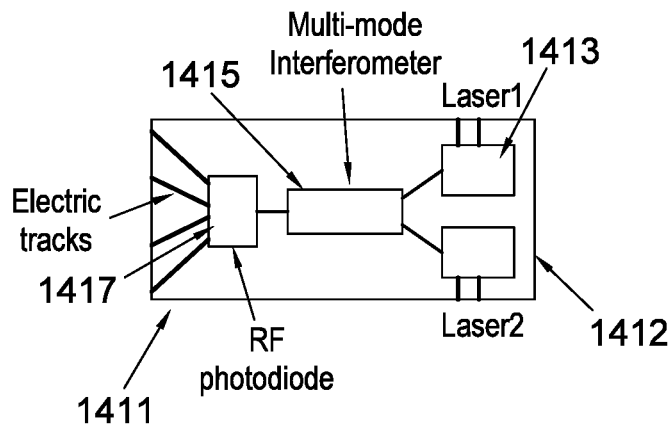
FIGS. 14(a), 14(b) and 14(c) are schematic illustrations of a quantum random number generator according to embodiments.
Figure 14B:
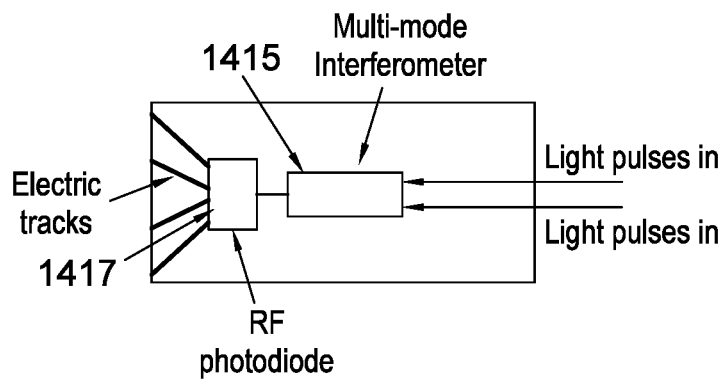
Figure 14C:
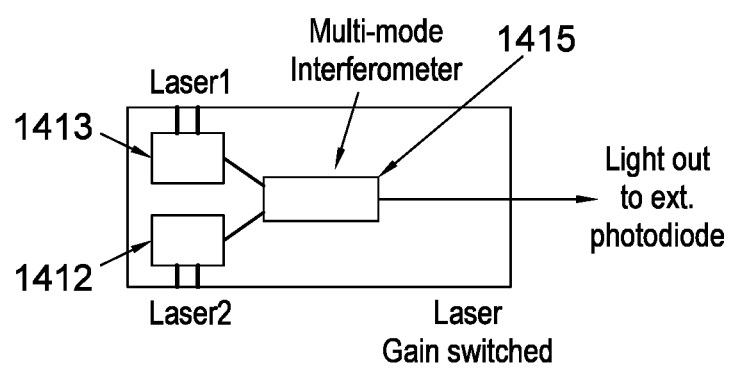

FIGS. 14(*a*) to 14(*c*) show further examples of PICs 1411. However, here instead of the AMZI of FIGS. 13(*a*) to 13(*c*), a multimode interferometer is used. In FIG. 14(*a*) two independent pulsed lasers, laser 1 1412 and laser 2 1413, are driven at equal repetition rates. The two lasers 1412, 1413 output light at the same intensity and wavelengths. When the repetition rate is low enough, each pulse from the stream of pulses may have a random phase. Furthermore, the streams of pulses from each laser are independent from each other and therefore the pulses from each laser have random phases relative to each other. The pulses from the two lasers temporally overlap and are interfered in multimode interferometer 1415, which may be, for example, a 2×2 directional coupler or a beam splitter. The interfered signal is sent to a photodetector 1417 where the intensity of the interfered pulse is converted to a signal. The signal corresponding to the intensity of the interfered pulse has a random value because the phases of the pulses from laser 1 1412 and laser 2 1413 are random. Random numbers may be generated from the random intensity of the interfered pulses.

Here the photodetector 1417 may be on chip (integrated in the PIC 101) as shown in FIGS. 14(*a*) and 14(*b*) or off chip as shown in FIG. 14(*c*). If off chip, the optical interface 105, 106 of the module 100 is used to couple light from the PCI 101 to the photodetector provided off the chip. If on chip, the electrical interface of the module is used to read out the measured intensities. The gain switched lasers 1412 and 1413 may be on chip (integrated in the PIC 101) as shown in FIGS. 14(*a*) and 14(*c*) or off chip as shown in FIG. 14(*b*). If off chip, the optical interface 105, 106 of the module 100 is used to couple light from the gain switched lasers provided off the chip to the PIC 101.

Figure 15A:
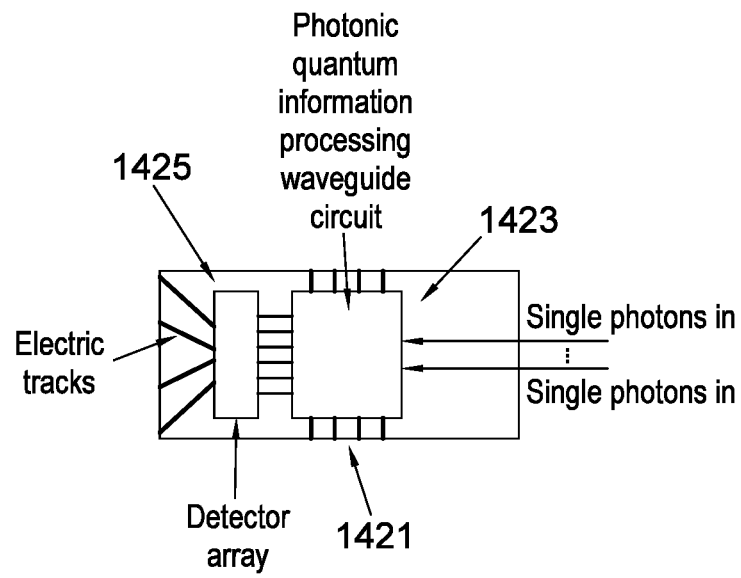
FIGS. 15(a), 15(b) and 15(c) are schematic illustrations of a quantum processor according to embodiments.
Figure 15B:
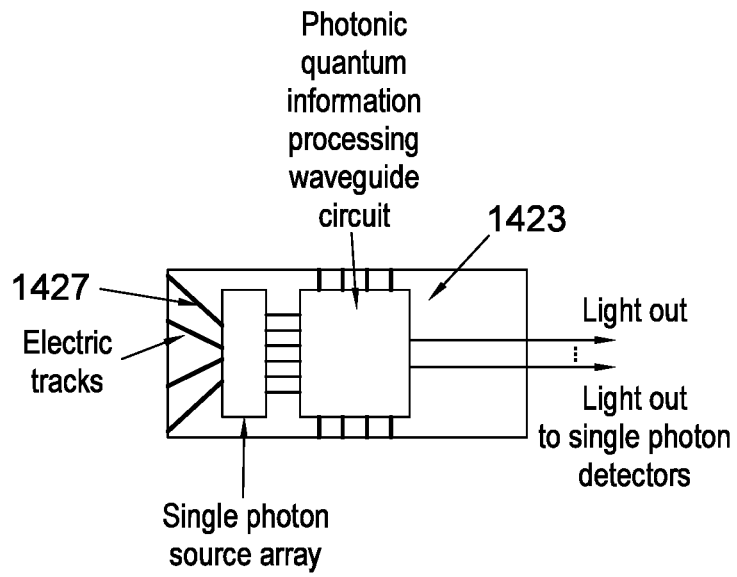
Figure 15C:
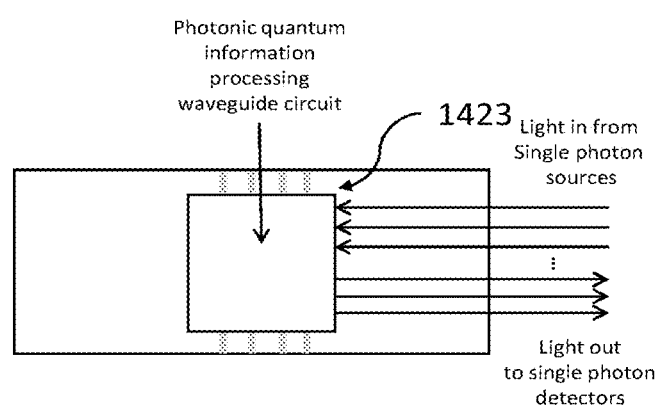

In another embodiment, the PIC 101 is configured for use in quantum computing. FIGS. 15(*a*) to (*c*) show such a module 1421. The module 1421 comprises a photonic integrated quantum processor 1423 which can process single photons produced externally or within the module. Control of the processor 1421 is possible with the host electronic board. In a photonic quantum processor, a waveguide circuit is fed with single photons. The waveguide circuit is used to route the photons, generate interferences, entanglement and perform computation according to quantum algorithms. Examples of such processors are discussed in GB 2555398.

FIG. 15(*a*) shows a diagram where the single photon input to be processed by the processing waveguide circuit 1423 is generated off the chip and detected after processing via detector array 1425. The detector array 1425 outputs electronic signals which are output from the chip via plug 105 of FIG. 1.

In FIG. 15(*b*), the optical input to the quantum processor 1423 is generated on the chip via photon array 1427. Here the processor processes the optical signals and outputs them using optical interface 105, 106 (FIG. 1) to an external detector.

It is also possible for the light to be processed to be generated off the chip and for the light signals output from the processor to be detected off the chip. Such an arrangement is shown in FIG. 15(*c*). Here, the light enters the chip and the light exits the chip from the same side. FIG. 16 shows an example of a fabrication sequence for a device that may be used in the receiver. In this example, the receiver is the type of device described for example in GB2551483. For completeness a description of this device is included below.

In this example, the device is an avalanche photodiode which is part of a photon detection device. The device comprises detection regions with an avalanche multiplication region integrated on a semiconductor substrate.

The device may be fabricated from one or more semiconductor materials, depending on the wavelength of the light which it is designed to detect.

Each detection region comprises an avalanche multiplication region. For each detection region, there is a corresponding contact. In this case the contact is an anode contact, however it will be appreciated that this could alternatively be a cathode contact. Each anode contact is connected to a metal contact region 308.

The basis for the heterostructure is a substrate 301, on which the subsequent layer structure is fabricated. The substrate may be an InP substrate for example.

A uniform heterolayer, the second layer 302, is deposited on said substrate 301. The second layer 302 may be an un-doped or lightly doped n-type InGaAs layer for example.

A uniform n+ type heterolayer, the highly doped layer 304, is deposited on said second layer 302. This layer may be a highly doped n-type InP layer for example.

A uniform layer, the first layer 303 is deposited on said highly doped layer 304. The first layer 303 may be un-doped or lightly doped n-type InP for example.

A cross-sectional view of the device at this stage in fabrication is shown in i.

Areas of highly-doped p-type material 305 are incorporated into the first layer 303. The areas may be incorporated by Zn diffusion, or alternatively by gas immersion laser doping or ion implantation for example.

In an embodiment, further areas of highly doped material, forming the guard ring regions 306, are also incorporated into the first layer 303. The guard ring regions may be formed in the same step as the highly doped regions 305, or in a separate step, and by the same method or by a different method.

A cross-sectional view of the device at this stage in fabrication is shown in ii.

In an alternative embodiment, the first 303 and second 302 layers may be silicon, in which p-type and n-type doping may be achieved using Boron or Phosphorous impurities respectively. The device may alternatively be based on a Silicon-Germanium heterostructure or based on any of the III-V class of semiconductors.

In an alternative embodiment, the device comprises highly n-doped regions 305 which are incorporated into a moderately doped n-type heterolayer 303, for example by gas immersion laser doping, implantation or diffusion.

The passivation layer 307 is deposited on the surface of the device, except for a portion of the surface above each highly doped region 305. The passivation layer 307 may be a dielectric, for example silicon nitride or silicon oxide.

A cross-sectional view of the device at this stage in fabrication is shown in iii.

The metal contact region 308 corresponding to each detection region is then deposited on the edge portion of the passivation layer and the outer portion of the inner portion of the highly doped region 305. For example, the metal contact region 308 may be a Chromium/Gold double layer where the highly doped p-type regions are InP. The metal contact region on the opposite surface of the substrate to the fabricated layers may be a different metal or semiconductor.

A cross-sectional view of the device at this stage in fabrication is shown in iv.

An anti-reflective coating 309 may be deposited on the remaining portion of the highly doped regions 305. The material of the anti-reflective coating 309 may depend on the wavelength of light intended for the detector. For example, for an InP based detector, silicon nitride with a selected thickness may be used so that the reflection at the surface is minimal.

A cross-sectional view of the device at this stage in fabrication is shown in v.

In the above example, two detectors are fabricated as there are two exposed portions of highly doped regions 305. However, the fabrication can also be used for just one detector.

FIGS. 17(a) and 17(b) show a schematic illustration of a distributed Bragg reflector (DBR) laser that can be provided on the PIC 101 in order to implement the coherent source 901 or the gain-switched laser 903. Although FIGS. 17(a) and (b) show a DBR laser, it will be understood that a distributed feedback (DFB) lasers or ridge lasers may alternatively be used.

The lasers may comprise a grating region. The grating region may be separate from the active region or the active region may comprise the grating. A laser where the active region and grating are separate is referred to as DBR (distributed Bragg reflector) laser. A DBR is shown in FIG. 17(a) and FIG. 17(b). A laser where the active region comprises the grating is a DFB laser.

A DBR is shown in FIGS. 17(a) and 17(b). FIG. 17(a) shows a side view of the DBR, and FIG. 17(b) shows a cross-section front view. The active area comprises a multi quantum well region (MQW). The MQW region comprises a plurality of quantum well layers. Where the laser is configured for 1.55 um operation, the MQW region comprises alternating layers of materials such as, for example: AlInGaAs/InP, AlInGaAs/AlInAs, InGaAsP/InP, InGaAsP/AlInAs or InGaAs/AlInGaAs. All these layers are lattice matched to an InP substrate.

The device comprises a substrate 400. On one surface of the substrate is an n-contact 426. Overlying and in contact with the opposite surface to the substrate 400 is the buffer layer 406. Both the substrate 400 and the buffer layer 406 are n-type layers. Alternatively, the structure can be reversed, such that the substrate 400 is a p-type layer. The layers may be n-doped InP. Overlying and in contact with the buffer layer 406 is the n-type layer 408. The n-type layer 408 may be n-doped InP. Overlying and in contact with a strip of the n-type layer 408 is a first waveguide material 410a. Overlying and in contact with the first waveguide material 410a is a MQW layer 412. Overlying and in contact with the MQW layer 410 is a second waveguide material 410b. On either side of the strip and overlying and in contact with the n-type material 408 is a p-type material 416, which may be p-doped InP. An n-type layer 418 is overlying and in contact with the p-type layer 416, and may be n-doped InP. The p-type layer 420 is overlying and in contact with the second waveguide layer 410b and the n-type layer 418, and may be p-doped InP. A p-type contact layer 422 is overlying and in contact with the p-type layer 420. In one embodiment, the p-type contact layer 422 is heavily doped InP, i.e. having a dopant concentration higher than that of layer 420. A p-contact metal 424 is overlying and in contact with part of the p-contact layer 422.

Figure 17:
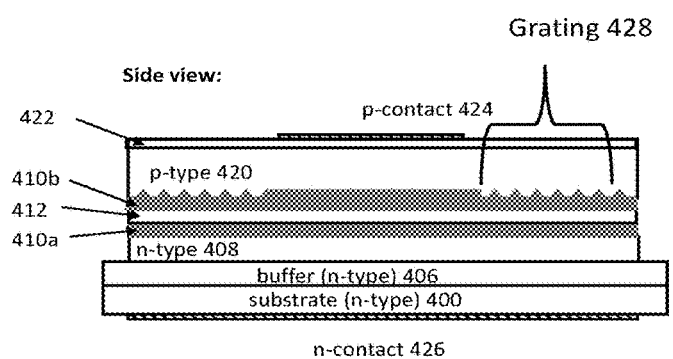
FIG. 17(a) is a schematic of a side view an emitter that can be used with the systems of the embodiments described herein.
FIG. 17(b) is a schematic of a cross-section front view of the emitter of FIG. 17 (a).
Figure 17:
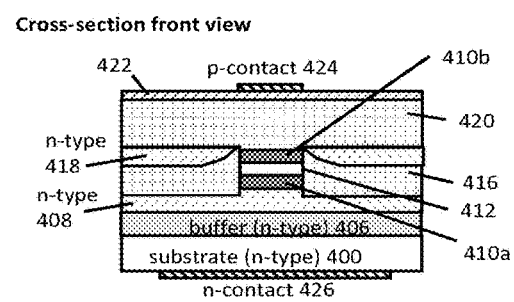

As shown in the side view in FIG. 17 (a) the MQW strip runs along the length of the device. There is a first p-type contact layer 424 over part of the MQW strip. On either side of the part of the strip under the first p-contact 424 along the direction in which light is emitted, there is a diffraction grating 428 in the second waveguide material.

A current is applied between the first p-contact 424 and the n-contact 426 in order to generate light in the MQW strip of the coherent light source 20. Light generated in the MQW strip of the laser is emitted along the MQW layer. The light is laterally confined by the p-type layer 416 and vertically confined by the waveguide layers 410$a$ and $b$. The light exits the MQW layer through an aperture of the laser.

In all of the above embodiment, techniques of integrating waveguides onto chips and combining such waveguides to form optical components such as those described in GB 2555398 can be used. Also, the fabrication techniques taught in GB 2555398 can be used to fabricate any of the above devices.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. An optical module comprising:
    a quantum photonic integrated circuit;
    a temperature control element;
    a housing configured to house said photonic integrated circuit and said temperature control element; and
    a circuit board configured to route electric signals to and/or from the photonic integrated circuit, wherein the circuit board is thermally isolated from the temperature control element,
    wherein the photonic integrated circuit is attached to the temperature control element, such that said photonic integrated circuit is in thermal communication with said temperature control element; and
    the temperature control element is attached directly to the housing, such that said temperature control element is in direct thermal communication with the housing.

2. A module according to claim 1 comprising an interposer chip, wherein the interposer chip is provided between the photonic integrated circuit and the temperature control element.

3. A module according to claim 2, wherein the interposer chip comprises a thermally conductive chip carrier.

4. A module according to claim 2, wherein the interposer chip is configured to route electric signals from the photonic integrated circuit to the circuit board.

5. A module according to claim 1, wherein the photonic integrated circuit comprises optical components and one or more light guiding sections, the one or more light guiding sections configured to optically connect one optical component to another.

6. A module according to claim 1, wherein the housing is configured to a dissipate heat.

7. A module according to claim 1, comprising a temperature sensor, wherein the temperature sensor is configured to monitor the temperature of the photonic integrated circuit.

8. A module according to claim 7, wherein the temperature sensor is provided on the photonic integrated circuit.

9. A module according to claim 1, comprising an optical component configured to collect or inject light into the photonic integrated circuit.

10. A module according to claim 1, wherein the temperature control element comprises a thermoelectric cooler or a resistive heater.

11. A module according to claim 1, wherein the photonic integrated circuit is configured to operate as:
    a quantum communication transmitter;
    a quantum communication receiver;
    a quantum random number generator; and/or
    a quantum information processor.

12. A system comprising:
    an optical module according claim 1; and
    a host electronic board,
    wherein the optical module is configured to be plugged into the host electronic board.

13. A system according to claim 12, wherein the host electronic board is configured to generate an electric signal for controlling the photonic integrated circuit.

14. A system according to claim 12, wherein the host electronic board is configured to generate an electric signal for controlling the temperature control element.

15. A system according to claim 12, wherein the host electronic board is configured to acquire an electric signal generated by the photonic integrated circuit.

16. A system according to claim 12, wherein,
    the host electronic board comprises a socket, and, wherein the circuit board is configured to plug into the socket.

17. A system according to claim 16, wherein the circuit board comprises a connector configured to plug into the socket.

18. A sending unit for a quantum communication system, the sending unit comprising:
    the system according to claim 12, wherein the photonic integrated circuit comprises:
        a quantum bit source configured to generate quantum bits;
        a quantum bit encoder configured to encode the generated quantum bits for sending to a receiving unit; and
        an intensity control element configured to modulate the intensity of the quantum bits.

19. A receiving unit for a quantum communication system, the receiving unit comprising:
    the system according to claim 12, wherein the photonic integrated circuit comprises a quantum bit decoder configured to decode encoded quantum bits generated by a sending unit.

20. A quantum communication system comprising:
    the sending unit of claim 18;
    the receiving unit of claim 19; and
    an optical link configured to connect the sending unit to the receiving unit.

* * * * *